(12) United States Patent
Tatsunari et al.

(10) Patent No.: US 7,132,300 B2
(45) Date of Patent: Nov. 7, 2006

(54) METHOD FOR FORMING FERROELECTRIC FILM AND SEMICONDUCTOR DEVICE

(75) Inventors: Toshitaka Tatsunari, Kyoto (JP); Shinichiro Hayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/878,228

(22) Filed: Jun. 29, 2004

(65) Prior Publication Data

US 2004/0266034 A1 Dec. 30, 2004

(30) Foreign Application Priority Data

Jun. 30, 2003 (JP) .............................. 2003-186923

(51) Int. Cl.
*H01L 21/312* (2006.01)
(52) U.S. Cl. .................... 438/3; 438/240; 438/244; 438/253; 438/387
(58) Field of Classification Search ................ 438/3, 438/240, 244, 253, 387, 396, FOR. 220, 438/FOR. 430
See application file for complete search history.

(56) References Cited

U.S. PATENT DOCUMENTS

| | | | |
|---|---|---|---|
| 5,840,615 A * | 11/1998 | Aoki et al. ................. 438/396 |
| 5,851,841 A * | 12/1998 | Ushikubo et al. ........... 438/240 |
| 6,485,564 B1 | 11/2002 | Liu et al. |
| 6,709,989 B1* | 3/2004 | Ramdani et al. ............. 438/763 |
| 6,716,663 B1* | 4/2004 | Morita et al. ................. 438/99 |
| 6,730,523 B1 | 5/2004 | Hintermaier et al. |
| 2003/0003770 A1* | 1/2003 | Morita et al. ............... 438/778 |

FOREIGN PATENT DOCUMENTS

| JP | 9-142844 | 6/1997 |
|---|---|---|
| JP | 2000-053422 A | 2/2000 |
| JP | 2001-521584 A | 11/2001 |
| WO | WO 00/36640 | 6/2000 |

* cited by examiner

*Primary Examiner*—George R. Fourson
*Assistant Examiner*—Joannie Adelle Garcia
(74) *Attorney, Agent, or Firm*—McDermott Will & Emery LLP

(57) ABSTRACT

In a method for forming a ferroelectric film of insulating metal oxide on a surface of an electrode with a concave or a convex or in convex shape which is formed above a substrate, multiple types of source gases constituting a material gas and each containing an organometallic compound are introduced into a chamber and main components of the multiple types of source gases are allowed to chemically react with one another with the chemical reaction proceeding depending on the reaction rate. Then, the ferroelectric film is deposited on the surface of the electrode.

8 Claims, 14 Drawing Sheets

METHOD FOR FORMING FERROELECTRIC FILM AND SEMICONDUCTOR DEVICE

BACKGROUND OF THE INVENTION (a) Fields of the Invention

The present invention relates to methods for forming a ferroelectric film made of insulating metal oxide and to semiconductor devices including such ferroelectric films.

(b) Description of Related Art

With recent progress in digital technologies, there is a growing trend to rapidly process or store a large capacity of data. In accordance with this trend, higher packing density and higher performance of semiconductor devices used in electronic equipment are demanded. To achieve higher packing density and lower power consumption of the semiconductor devices, research and development is widely conducted on the technology to employ, for capacitor elements in the devices, capacitor insulating films made of films of high dielectric constant instead of conventional capacitor insulating films made of silicon oxide or silicon nitride. Moreover, with the aim of putting into practical use nonvolatile RAMs capable of performing rapid writing and reading operations at conventionally impracticable low operating voltage, research and development is actively conducted on ferroelectric films as capacitor insulating films having spontaneous polarization properties.

Of semiconductor memory devices employing high dielectric constant films or ferroelectric films as capacitor insulating films, those with ultrahigh packing density use three-dimensional memory cells as alternatives to conventional stacked memory cells.

In fabricating a three-dimensional memory cell, a capacitor insulating film made of a ferroelectric film has to be formed on a lower electrode with steps. Therefore, practical utilization of capacitor insulating film formation methods using CVD techniques capable of providing excellent step coverage is strongly demanded. In particular, one method for forming a capacitor insulating film of a ferroelectric film using metal organic chemical vapor deposition (referred hereinafter to as MOCVD) is a method for forming bismuth oxide by MOCVD using bismuth organometallic compound with bismuth-oxygen bonds as a material (see, for example, Japanese Unexamined Patent Publication No. 09-142844, (page 5, paragraph 27)).

A conventional method for forming a ferroelectric film will be described below with reference to FIG. 19.

Referring to FIG. 19, a first material container 101 made of stainless steel is provided within a first constant temperature bath 100. Bismuth tributoxide filled in the first material container 101 is heated to 80 to 110° C. Argon gas is introduced into the first material container 101 at a flow rate of 50 to 100 ml/min (in a normal state), and then bismuth tributoxide is sublimated at an elevated temperature and a reduced pressure. Subsequently, the sublimated bismuth tributoxide is introduced into a gas line 102 kept at about 110° C. and carried to an MOCVD reaction chamber 103.

A second material container 105 is provided within a second constant temperature bath 104. Tantalum pentaethoxide ($Ta(OC_2H_5)_5$) filled in the second material container 105 is heated to 120° C. and then bubbled using argon gas with a flow rate of 50 to 100 ml/min (in a normal state). Subsequently, the gasified tantalum pentaethoxide ($Ta(OC_2H_5)_5$) is introduced into a gas line 106 of stainless steel heated to 130° C. and carried to the MOCVD reaction chamber 103. Strontium dipivaloylmethane tetraethylenepentamine ($C_{38}H_{84}O_4N_{10}Sr$) filled in a third material container (not shown) is heated to 150° C. and then bubbled using argon gas with a flow rate of 50 to 100 ml/min (in a normal state). The gasified strontium DPM tetraethylenepentamine is introduced into a gas line (not shown) of stainless steel heated to 160° C. and carried to the MOCVD reaction chamber 103.

The MOCVD reaction chamber 103 is equipped with a base stage 108 which has a base 107 of platinum (Pt) provided on its upper surface. Onto the surface of the base 107 kept at 400 to 800° C., preferably at 450 to 700° C., the three types of source gases shown above, that is, bismuth tributoxide, tantalum pentaethoxide ($Ta(OC_2H_5)_5$), and strontium dipivaloylmethane tetraethylenepentamine ($C_{38}H_{84}O_4N_{10}Sr$) are simultaneously introduced accompanied with oxygen gas and argon gas for dilution. Then, a ferroelectric film made of insulating oxide containing Bi, Sr, and Ta is formed on the surface of the base 107.

In order to obtain a ferroelectric film containing components in desired proportions (Bi:Sr:Ta=2:1:2), it is sufficient that the flow rates of argon gases introduced into the first to third material containers or the heating temperatures of the first to third material containers are adjusted to control supplies of the source gases to the MOCVD reaction chamber 103. This control can grow a ferroelectric film made of insulating oxide represented by $SrBi_2Ta_2O_9$.

We conducted various studies on the conventional example mentioned above. From these studies, we found the following fact: in forming a ferroelectric capacitor element which has a capacitor insulating film made of a ferroelectric film, it is difficult, by simply adjusting the flow rates of the argon gases or the heating temperatures of the source gases, to realize the ferroelectric film having an excellent step coverage over an electrode of the element and concurrently to control the components of the ferroelectric film to desired proportions.

More specifically, to provide the ferroelectric film of an SBT film composed in proportions of Sr:Bi:Ta:O=1:2:2:9, we adjusted not only the flow rates of the argon gases or the heating temperatures of the source gases but also the mixture ratio of the source gases introduced in the MOCVD reaction chamber 103. Then, we were able to form a ferroelectric film composed in a desired composition represented by $SrBi_2Ta_2O_9$.

In this case, in order to provide the ferroelectric film composed in proportions of Sr:Bi:Ta:O=1:2:2:9, the MOCVD reaction chamber 103 was supplied with sufficient amounts of the source gases. Therefore, the chemical reaction within the MOCVD reaction chamber 103 proceeded depending on the rate of the gas supplies, which caused the disadvantage that the ferroelectric film having an excellent step coverage over the electrode cannot be formed. In particular, for a capacitor insulating film used for a three-dimensional ferroelectric capacitor element formed with an ultrafine pattern necessary for high integration, we found the disadvantage that desired polarization properties cannot be obtained because of an inadequate step coverage of the ferroelectric film over the electrode.

On the other hand, a ferroelectric film made of an SBT (SrBiTa) film was formed by adjusting the flow rates of the argon gases or the heating temperatures of the source gases to develop the chemical reaction within the MOCVD reaction chamber 103 depending on the reaction rate of the gases. Then, we were able to form the ferroelectric film having an excellent step coverage over the electrode. From this result, in order to form a ferroelectric film of an SBT film containing components in desired proportions with the chemical reaction for film growth proceeding depending on the reaction rate of the gases, a fine adjustment of the flow rates of the argon gases or the heating temperatures of the source gases was made to form a ferroelectric film. In this approach, however, the proportions of components of the formed ferroelectric film made of an SBT film could hardly be changed, and therefore the formed film failed to have desired polarization properties.

SUMMARY OF THE INVENTION

In view of the foregoing, an object of the present invention is to improve the step covarage of a ferroelectric film. A further object of the present invention is to improve the step covarage of a ferroelectric film and concurrently to control components of the ferroelectric film to desired proportions.

To attain the above objects, a first ferroelectric film formation method according to the present invention is a method for forming a ferroelectric film of insulating metal oxide on a surface of an electrode formed above a substrate, the electrode having a concave or a convex or being of convex shape. This method is characterized in that multiple types of source gases constituting a material gas and each containing an organometallic compound are introduced into a chamber and main components of the multiple types of source gases are allowed to chemically react with one another with the chemical reaction proceeding depending on the reaction rate, thereby depositing the ferroelectric film on the surface of the electrode.

In the first ferroelectric film formation method of the present invention, the chemical reaction for film deposition proceeds depending on the reaction rate of the material gas. Therefore, the chemical reaction of main components of the source gases proceeds around the surface of the electrode, which improves the step coverage of the ferroelectric film over the electrode.

Preferably, in the first ferroelectric film formation method of the present invention, the chemical reaction proceeding depending on the reaction rate is carried out under a condition in which the temperature of the substrate during the chemical reaction is 470° C. or lower.

With this method, the substrate temperature is set at 470° C. or lower, whereby the chemical reaction for film deposition proceeds depending on the reaction rate of the material gas. Therefore, the chemical reaction of main components of the source gases proceeds around the surface of the electrode, which improves the step coverage of the ferroelectric film over the electrode.

Preferably, in the first ferroelectric film formation method of the present invention, the chemical reaction proceeding depending on the reaction rate is carried out under a condition in which the pressure within the chamber during the chemical reaction is $6.99 \times 10^2$ Pa or lower.

With this method, the chamber pressure is set at $6.99 \times 10^2$ Pa or lower, whereby the mean free paths of molecules in the chamber increase to raise the diffusion constants of the source gases. Moreover, the chemical reaction for film deposition proceeds depending on the reaction rate of the material gas, so that the chemical reaction of main components of the source gases with one another proceeds around the surface of the electrode. Consequently, the step coverage of the ferroelectric film over the electrode is improved.

A second ferroelectric film formation method according to the present invention is a method for forming a ferroelectric film of insulating metal oxide on a surface of an electrode formed above a substrate, the electrode having a concave or a convex or being of convex shape. Preferably, in this method, multiple types of source gases constituting a material gas and each containing an organometallic compound are introduced into a chamber and main components of the multiple types of source gases are allowed to chemically react with one another under a film growth condition in which the film growth in a horizontal direction to the surface of the electrode is dominant, thereby depositing the ferroelectric film on the surface of the electrode.

With the second ferroelectric film formation method, the chemical reaction for film deposition proceeds in the horizontal growth-dominant region on the electrode surface. Therefore, within the chamber, the ferroelectric film grows horizontally more than vertically, which improves the step coverage of the ferroelectric film over the electrode.

Preferably, in the second ferroelectric film formation method of the present invention, the chemical reaction is carried out so that the ferroelectric film grows at a growth rate of 7 nm per minute or lower during the chemical reaction.

With this method, the ferroelectric film is deposited on the surface of the electrode at a growth rate of 7 nm per minute or lower, so that the chemical reaction for film deposition proceeds in the horizontal growth-dominant region on the electrode surface. Therefore, within the chamber, the ferroelectric film grows horizontally more than vertically, which improves the step coverage of the ferroelectric film over the electrode.

A third ferroelectric film formation method according to the present invention is a method for forming a ferroelectric film of insulating metal oxide on a surface of an electrode formed above a substrate, the electrode having a concave or a convex or being of convex shape. This method is characterized by comprising the steps of: introducing into a chamber multiple types of source gases which constitute a material gas and which each contain an organometallic compound, and allowing main components of the multiple types of source gases to chemically react with one another, thereby producing intermediates with local fluidity on the surface of the electrode; and depositing the ferroelectric film on the surface of the electrode by the chemical reaction of the intermediates.

In the third ferroelectric film formation method of the present invention, the process of allowing main components of the source gases to chemically react with one another includes the step of producing intermediates with local fluidity. This improves the step coverage of the formed ferroelectric film over the electrode.

Preferably, in the first to third ferroelectric film formation methods of the present invention, the material gas contains two or more source gases selected from $Sr[Ta(OC_2H_5)_5(OC_2H_4OCH_3)]_2$, $Bi[OC(CH_3)_2(CH_2OCH_3)]_3$, $Ta(OC_2H_5)_5$, $Nb(OC_2H_5)_5$, $La[OC(CH_3)_2(CH_2OCH_3)]_3$, $La(OC_2H_5)_4$, $Ti(OC_2H_5)_4$, and $Ti[OC(CH_3)_2(CH_2OCH_3)]_3$.

With this method, organometallic solution is employed as the source gases, which further improves the step coverage of the ferroelectric film over the electrode.

Preferably, in the first to third ferroelectric film formation methods of the present invention, the material gas is a gas mixture of a first source gas made of $Ta(OC_2H_5)_5$ and a second source gas made of $Sr[Ta(OC_2H_5)_5(OC_2H_4OCH_3)]_2$.

This method has a characteristic in which when the mixture ratio of the first source gas to the second source gas increases beyond a predetermined value, only the proportion of the second source gas in the ferroelectric film varies. Therefore, in the ferroelectric film, the proportion of Sr (metal element constituting an A site) contained in the second source gas can be controlled. This enables a further control of the Bi and Ta proportions of the ferroelectric film.

In the above case, the gas mixture composed of the first source gas and the second source gas may be mixed at a desired mixture ratio either before or after introduction into the chamber.

A fourth ferroelectric film formation method according to the present invention is a method for forming a ferroelectric film of insulating metal oxide on a surface of an electrode, the electrode having a concave or a convex or being of convex shape. This method is characterized by comprising: a first step of determining the temperature of a substrate and the pressure within a chamber serving as growth conditions of the ferroelectric film so that the ferroelectric film has a desired rate of step coverage over the electrode or more; a second step of adjusting, at the substrate temperature and the chamber pressure determined by the first step, the proportion of a metal element constituting an A site of the ferroelectric film by changing the mixture ratio of multiple types of source gases which each contain an organometallic compound and which constitute a first material gas introduced into the chamber; a third step of adjusting, under the condition in which the proportion of the metal element constituting the A site is kept constant, the proportion of a metal element constituting a B site of the ferroelectric film by changing the mixture ratio of multiple types of source gases which each contain an organometallic compound and which constitute a second material gas introduced into the chamber, thereby determining the proportions of components of the ferroelectric film; and a fourth step of depositing the ferroelectric film on the surface of the electrode based on the film growth conditions determined in the first step and the proportions determined in the second and third steps.

With the fourth ferroelectric film formation method of the present invention, the ferroelectric film can be formed which has an excellent step coverage over the electrode. Also, the mixture ratio of the source gases constituting the material gas can be determined by a simple approach to form the ferroelectric film containing components in desired proportions.

Preferably, in the fourth ferroelectric film formation method of the present invention, the first material gas comprises a gas mixture of a source gas containing Ta and a source gas containing Sr, and the second material gas comprises a gas mixture of a source gas containing Bi and a source gas containing Sr.

With this method, when the mixture ratio of the source gas containing Ta to the source gas containing Sr in the first material gas is changed beyond a certain value, the proportion of Sr (metal element constituting the A site) of the ferroelectric film alone varies even though the Bi proportion of the ferroelectric film is nearly constant. Also, when the mixture ratio of the source gas containing Bi to the source gas containing Sr in the second material gas is changed, the proportion of Bi (metal element constituting the B site) of the ferroelectric film linearly varies. Therefore, components of the ferroelectric film can be controlled in desired proportions.

Preferably, in the fourth ferroelectric film formation method, the first material gas comprises a gas mixture of a source gas containing Bi and a source gas containing La, and the second material gas comprises a gas mixture of a source gas containing Ti and a source gas containing La.

With this method, when the mixture ratio of the source gas containing Ti to the source gas containing La in the first material gas is changed, the proportion of Bi (metal element constituting the A site) of the ferroelectric film linearly varies up to a certain mixture ratio and then nonlinearly varies beyond it. Also, when the mixture ratio of the source gas containing Bi to the source gas containing La in the second material gas is changed beyond a certain value, the proportion of La (metal element constituting the B site) of the ferroelectric film alone varies even though the Bi proportion of the ferroelectric film is nearly constant. Therefore, components of the ferroelectric film can be controlled in desired proportions.

A fifth ferroelectric film formation method according to the present invention is a method for forming a ferroelectric film of insulating metal oxide on a surface of an electrode, the electrode having a concave or a convex or being of convex shape. This method is characterized by comprising: a first step of determining the temperature of a substrate and the pressure within a chamber serving as growth conditions of the ferroelectric film so that the ferroelectric film has a desired rate of step coverage over the electrode or more; a second step of adjusting, at the substrate temperature and the chamber pressure determined by the first step, the proportion of a metal element constituting a B site of the ferroelectric film by changing the mixture ratio of multiple types of source gases which each contain an organometallic compound and which constitute a first material gas introduced into the chamber; a third step of adjusting, under the condition in which the proportion of the metal element constituting the B site is kept constant, the proportion of a metal element constituting an A site of the ferroelectric film by changing the mixture ratio of multiple types of source gases which each contain an organometallic compound and which constitute a second material gas introduced into the chamber, thereby determining the proportions of components of the ferroelectric film; and a fourth step of depositing the ferroelectric film on the surface of the electrode based on the film growth conditions determined in the first step and the proportions determined in the second and third steps.

With the fifth ferroelectric film formation method of the present invention, the ferroelectric film can be formed which has an excellent step coverage over the electrode. Also, the mixture ratio of the source gases constituting the material gas can be determined by a simple approach to form the ferroelectric film containing components in desired proportions.

Preferably, in the fifth ferroelectric film formation method of the present invention, the first material gas comprises a gas mixture of a source gas containing Bi and a source gas containing Sr, and the second material gas comprises a gas mixture of a source gas containing Ta and a source gas containing Sr.

With this method, when the mixture ratio of the source gas containing Bi to the source gas containing Sr in the first material gas is changed, the proportion of Bi (metal element constituting the B site) of the ferroelectric film linearly varies. Also, when the mixture ratio of the source gas containing Ta to the source gas containing Sr in the second material gas is changed beyond a certain value, the proportion of Sr (metal element constituting the A site) of the ferroelectric film alone varies even though the Bi proportion of the ferroelectric film is nearly constant. Therefore, components of the ferroelectric film can be controlled in desired proportions.

Preferably, in the fifth ferroelectric film formation method of the present invention, the first material gas comprises a gas mixture of a source gas containing Ti and a source gas containing La and the second material gas comprises a gas mixture of a source gas containing Bi and a source gas containing La.

With this method, when the mixture ratio of the source gas containing Ti to the source gas containing La in the first material gas is changed beyond a certain value, the proportion of La (metal element constituting the B site) of the ferroelectric film alone varies even though the Bi proportion of the ferroelectric film is nearly constant. Also, when the mixture ratio of the source gas containing Bi to the source gas containing La in the second material gas is changed, the proportion of Bi (metal element constituting the A site) of the ferroelectric film linearly varies up to a certain mixture ratio and then nonlinearly varies beyond it. Therefore, components of the ferroelectric film can be controlled in desired proportions.

A semiconductor device of the present invention comprises: an electrode formed above a substrate and having a concave or a convex in or on the surface thereof; and a ferroelectric film formed on the electrode. This device is characterized in that on a step present on the concave or the convex, the rate of step coverage of the ferroelectric film is 80% or higher, and the variation in the proportion of each of metal elements constituting the ferroelectric film is ±15% or lower.

With the semiconductor device of the present invention, a semiconductor device can be provided which includes a ferroelectric film having an excellent step coverage and containing components in desired proportions.

Preferably, in the semiconductor device of the present invention, the metal elements constituting the ferroelectric film include Sr, Bi, and Ta, and when the Ta proportion of the ferroelectric film is standardized by 2, the Sr proportion of the ferroelectric film is from 0.75 to 1.00 inclusive and the Bi proportion of the ferroelectric film is from 2.00 to 2.50 inclusive.

As shown above, a semiconductor device can be provided which includes a ferroelectric film containing components in desired proportions.

Preferably, in the semiconductor device of the present invention, the metal elements constituting the ferroelectric film include Bi, La, and Ti, and when the Ti proportion of the ferroelectric film is standardized by 3, the La proportion of the ferroelectric film is from 0.5 to 1.0 inclusive and the Bi proportion of the ferroelectric film is from 3.0 to 3.5 inclusive.

As shown above, a semiconductor device can be provided which includes a ferroelectric film containing components in desired proportions.

DETAILED DESCRIPTION OF THE PREFERRED EMBODIMENTS

First, with reference to FIGS. 1A to 1C, description will be made of an exemplary structure of a ferroelectric capacitor element having a ferroelectric film formed by a ferroelectric film formation method according to embodiments of the present invention.

Figure 1A:
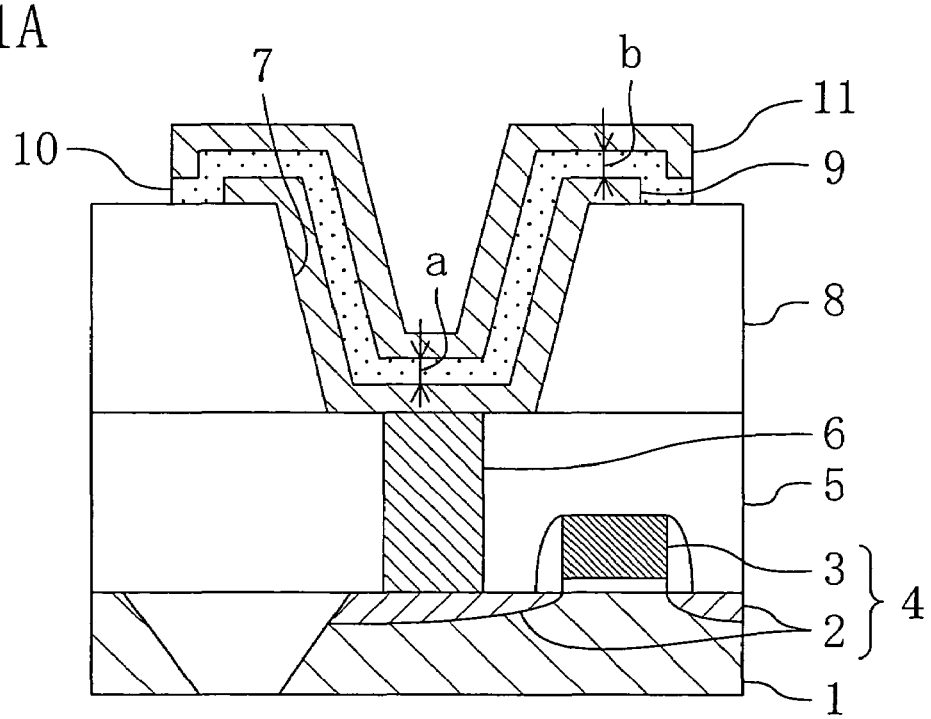
FIGS. 1A to 1C are sectional views of ferroelectric capacitor elements each having a ferroelectric film formed by a ferroelectric film formation method according to embodiments of the present invention.
Figure 1B:
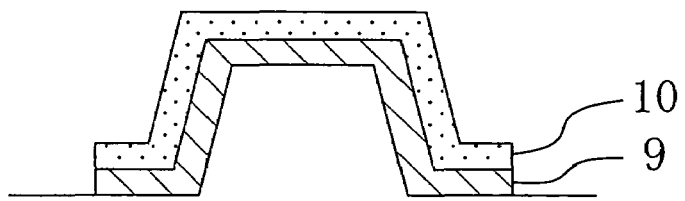
Figure 1C:
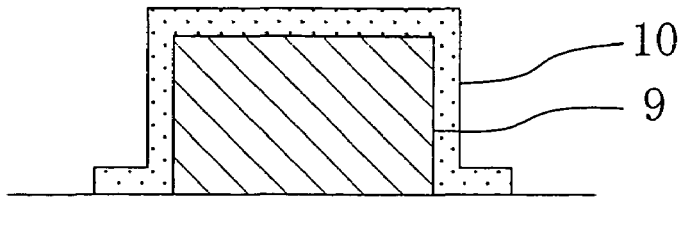

Referring to FIG. 1A, in a surface portion of a semiconductor substrate 1, doped layers 2 are formed which serve as a source region or a drain region. Above the semiconductor substrate 1, a gate electrode 3 is formed with a gate insulating film interposed therebetween. The doped layers 2 and the gate electrode 3 constitute a field-effect transistor 4.

Above the semiconductor substrate 1, a passivation film 5 is deposited to cover the field-effect transistor 4. Through the passivation film 5, a contact plug 6 made of tungsten is buried whose lower end is connected to the doped layer 2.

Above the passivation film 5, an interlayer insulating film 8 is formed which has a concave opening 7 for exposing the upper end of the contact plug 6. In the concave opening 7, a first electrode 9, a capacitor insulating film and a second electrode 11 are sequentially formed from bottom to top. The lower surface of the first electrode 9 is connected to the upper end of the contact plug 6. The capacitor insulating film is formed of a ferroelectric film 10 deposited by a ferroelectric film formation method according to each embodiment.

In the ferroelectric capacitor element shown in FIG. 1A, one case as shown above has been described where the ferroelectric film 10 is formed on the surface of the first electrode 9 with a concave. Alternatively, as shown in FIG. 1B, the ferroelectric film 10 may be formed on the surface of the first electrode 9 with a convex. As shown in FIG. 1C, the ferroelectric film 10 may be formed on the surface of the first electrode 9 in convex shape.

It is to be noted that the rate of step coverage used in the following embodiments is a value represented using, as shown in FIG. 1A, the thickness a of part of the ferroelectric film 10 located on the bottom of the opening 7 and the thickness b of part of the ferroelectric film 10 located above the interlayer insulating film 8. To be more specific, the rate of step coverage is a value represented by the following equation:

the rate of step coverage=$a/b \times 100(\%)$.

First Embodiment

In a first embodiment, with reference to FIGS. 2 and 3, description will be made of first and second ferroelectric film formation systems used for ferroelectric film formation methods according to second to seventh embodiments that will be described later.

First, the first ferroelectric film formation system will be described with reference to FIG. 2.

Figure 2:
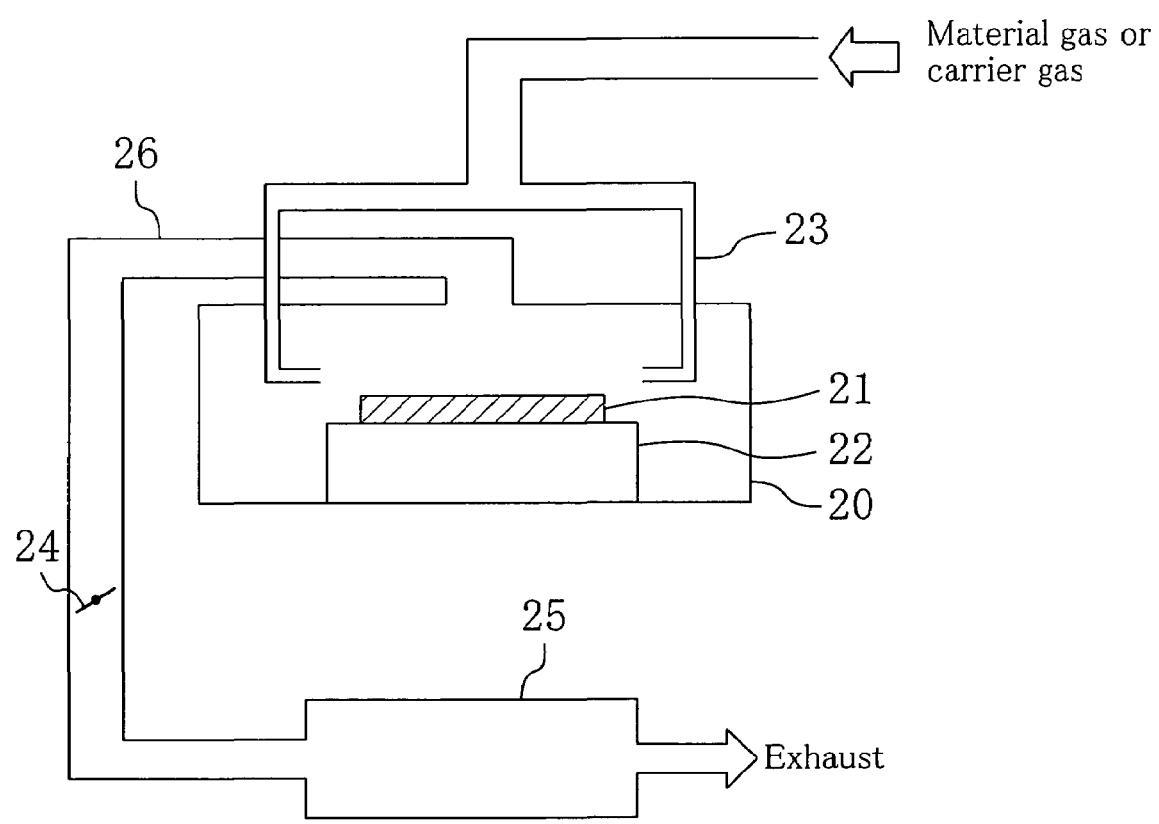
FIG. 2 is a sectional view of a first ferroelectric film formation system according to a first embodiment of the present invention.

Referring to FIG. 2, a susceptor 22 with a semiconductor substrate 21 mounted is set within a chamber 20. The chamber 20 is provided with a gas supply line 23 for introducing a material gas as well as a carrier gas such as oxygen gas through a mass flow controller (not shown) or the like. The material gas is made of multiple types of source gases regulated to a desired mixture ratio. Also, the chamber 20 is provided with a gas exhaust line 24 which has a pressure control valve 25 and a pump 26 and which exhausts gas within the chamber 20.

Next, the second ferroelectric film formation system will be described with reference to FIG. 3.

Figure 3:
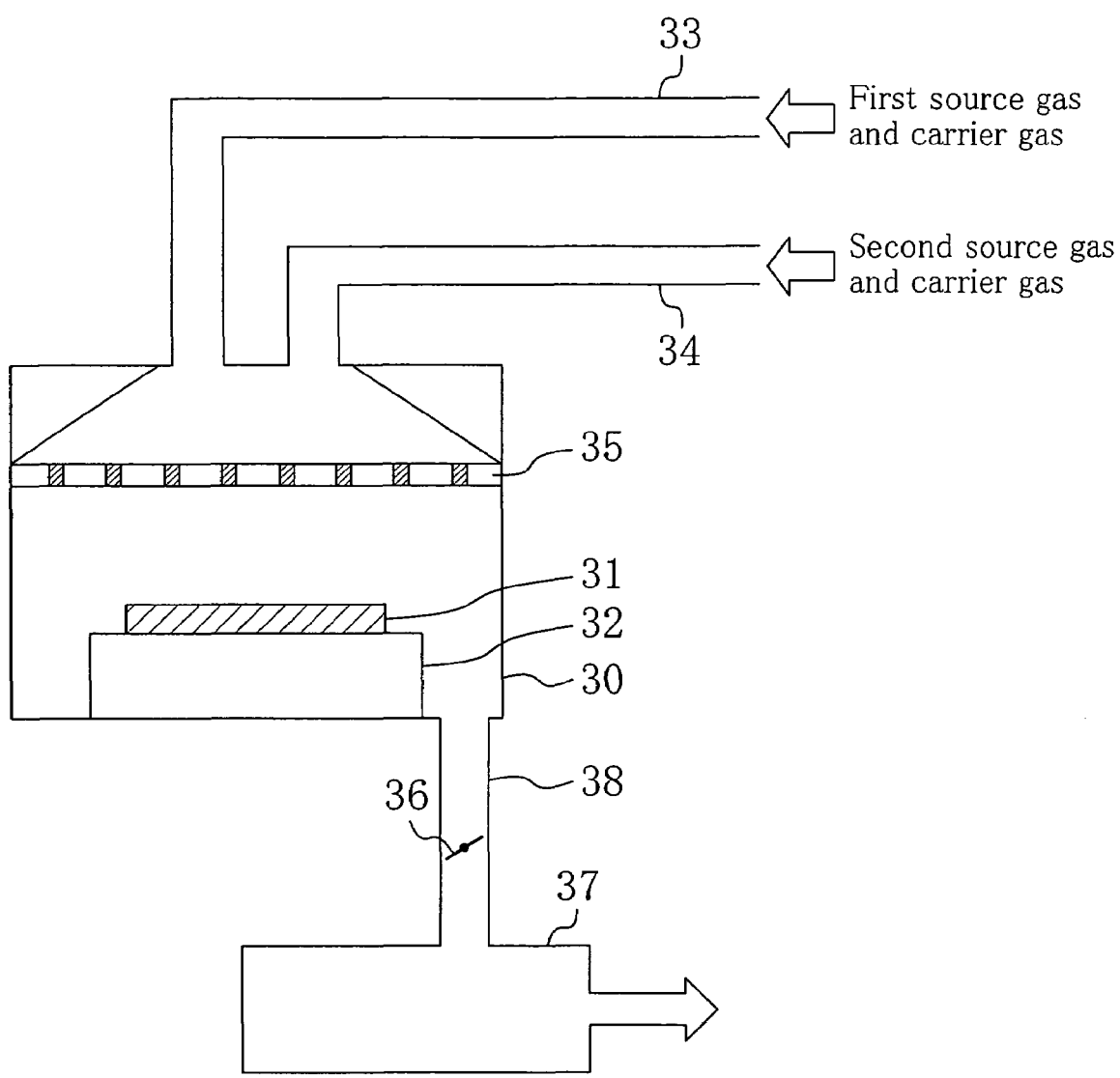
FIG. 3 is a sectional view of a second ferroelectric film formation system according to the first embodiment of the present invention.

Referring to FIG. 3, a susceptor 32 with a semiconductor substrate 31 mounted is set within a chamber 30. The chamber 30 is provided with a first gas supply line 33 and a second gas supply line 34. The first gas supply line 33 introduces a first source gas as well as a carrier gas such as oxygen gas through a mass flow controller (not shown) or the like. The second gas supply line 34 introduces a second source gas as well as a carrier gas such as oxygen gas through a mass flow controller (not shown) or the like. The carrier gas and the first and second source gases having been introduced within the chamber 30 are distributed into and discharged from gas nozzles 35. Also, the chamber 30 is provided with a gas exhaust line 38 which has a pressure control valve 36 and a pump 37 and which exhausts gas within the chamber 30.

The first ferroelectric film formation system forms a ferroelectric film 10 using a material gas made of multiple types of source gases which have been mixed in a desired mixture ratio before they are introduced within the chamber 20. The second ferroelectric film formation system forms the ferroelectric film 10 using a material gas made of first and second source gases which are mixed in a desired mixture ratio after they are introduced into the chamber 30. Ferroelectric film formation methods according to second to seventh embodiments can be implemented using either of the first and second ferroelectric film formation systems.

The material gas made of multiple types of source gases preferably includes two or more source gases selected from $Sr[Ta(OC_2H_5)_5(OC_2H_4OCH_3)]_2$, $Bi[OC(CH_3)_2(CH_2OCH_3)]_3$, $Ta(OC_2H_5)_5$, $Nb(OC_2H_5)_5$, $La[OC(CH_3)_2(CH_2OCH_3)]_3$, $La(OC_2H_5)_4$, $Ti(OC_2H_5)_4$, and $Ti[OC(CH_3)_2(CH_2OCH_3)]_3$. The material gas with these components employs organometallic solution as the multiple types of source gases, so that the step coverage of the ferroelectric film 10 over the first electrode 9 is further improved as described later.

If the material gas made of multiple types of source gases is a gas mixture composed of a source gas of $Ta(OC_2H_5)_5$ and a source gas of $Sr[Ta(OC_2H_5)_5(OC_2H_4OCH_3)]_2$, the Sr, Bi and Ta proportions of the ferroelectric film 10 are readily controlled as described later.

The first and second ferroelectric film formation systems are not limited to the systems with the structures shown in FIGS. 2 and 3, respectively. For example, it goes without saying that the number of gas supply lines for introducing the carrier gas, the source gas, or the material gas into the chamber 20 or 30 is not limited to the number illustrated.

Second Embodiment

In the case where the ferroelectric film 10 is deposited by MOCVD on the surface of the first electrode 9, we carried out various studies of the presence or absence of parameters capable of adjusting components of the ferroelectric film 10 to desired proportions and concurrently capable of improving the step coverage of the ferroelectric film 10 over the first electrode 9. The result of these studies will be described below.

From the various studies, we found the fact that the step coverage of the ferroelectric film 10 over the first electrode 9 is improved if the ferroelectric film 10 is formed under the condition in which the temperature of the semiconductor substrate 1 (referred hereinafter to as the substrate temperature) is lowered.

A ferroelectric film formation method according to a second embodiment of the present invention will be described below with reference to FIGS. 2, 3, and 4.

Multiple types of source gases constituting a material gas are introduced into the chambers 20 and 30 (see FIGS. 2 and 3) and main components of the source gases are allowed to chemically react with one another under several conditions in which the substrate temperature is 470° C. or lower. Then, the ferroelectric film 10 is formed on the surface of the first electrode 9.

The relation in each condition between the substrate temperature and the rate of step coverage of the ferroelectric film 10 over the first electrode 9 will be described below with reference to FIG. 4.

Figure 4:
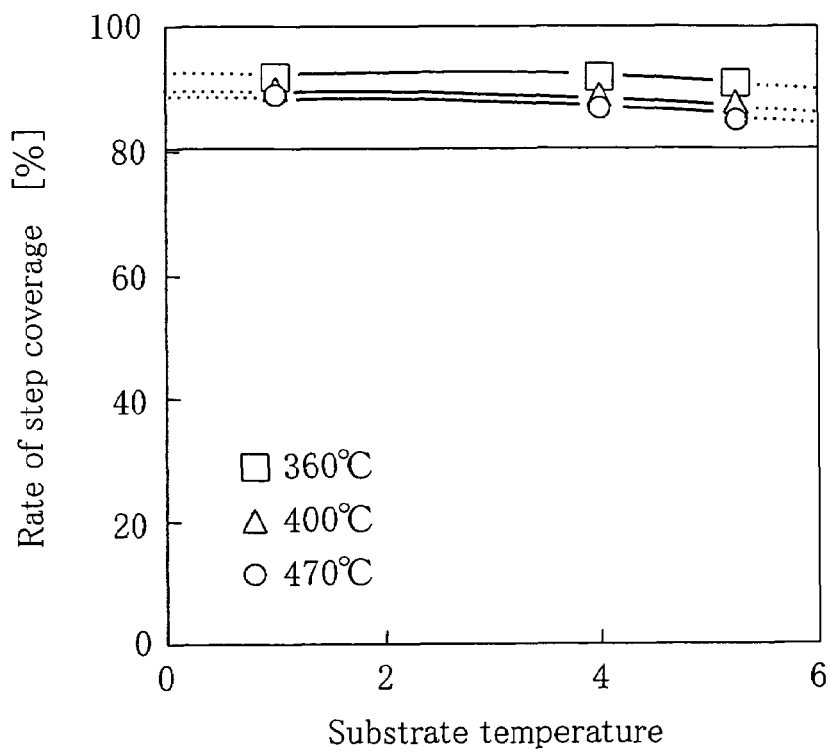
FIG. 4 is a graph showing the relation between the substrate temperature and the rate of step coverage in a ferroelectric film formation method according to a second embodiment of the present invention.

As shown in FIG. 4, it is found that when the ferroelectric film 10 is formed under conditions in which the substrate temperatures are 470° C., 400° C., and 360° C., all the ferroelectric films 10 formed under these conditions have rates of step coverage over the first electrode 9 of 80% or more. This leads to one requirement for growth of the ferroelectric film 10. The requirement is to set the substrate temperature at 470° C. or lower, thereby improving the step coverage of the ferroelectric film 10 over the first electrode 9.

In contrast to this, although not shown in FIG. 4, if the ferroelectric film 10 is formed under a condition in which the substrate temperature is 500° C. or higher, the rate of step coverage of the formed ferroelectric film 10 over the first electrode 9 is 20 to 30% because the chemical reaction for the film formation proceeds depending on the material gas supply rate. This fails to form the ferroelectric film 10 having a good step coverage over the first electrode 9.

Next description will be made of the mechanism by which the step coverage of the ferroelectric film 10 formed at a substrate temperature of 470° C. or lower is improved.

Since the substrate temperature is lowered, the chemical reaction for film formation proceeds depending on the reaction rate of the material gas. Therefore, the chemical reaction of main components of the multiple types of source gases with one another proceeds around the surface of the first electrode 9, and intermediates with local fluidity created in the process of the chemical reaction stay on the surface of the ferroelectric film 10 for a prolonged period of time. This improves the step coverage of the ferroelectric film 10 over the first electrode 9.

The material gas made of multiple types of source gases preferably includes two or more source gases selected from $Sr[Ta(OC_2H_5)_5(OC_2H_4OCH_3)]_2$, $Bi[OC(CH_3)_2(CH_2OCH_3)]_3$, $Ta(OC_2H_5)_5$, $Nb(OC_2H_5)_5$, $La[OC(CH_3)_2(CH_2OCH_3)]_3$, $La(OC_2H_5)_4$, $Ti(OC_2H_5)_4$, and $Ti[OC(CH_3)_2(CH_2OCH_3)]_3$. The material gas with these components employs organometallic solution as the multiple types of source gases, so that the step coverage of the ferroelectric film 10 over the first electrode 9 is further improved.

If the material gas made of multiple types of source gases is a gas mixture composed of a source gas of $Ta(OC_2H_5)_5$ and a source gas of $Sr[Ta(OC_2H_5)_5(OC_2H_4OCH_3)]_2$, the Sr, Bi and Ta proportions of the ferroelectric film 10 are readily controlled as described later.

As is apparent from the above, in the second embodiment, the ferroelectric film 10 is formed under the condition in which the substrate temperature is 470° C. or lower, whereby the chemical reaction for film formation proceeds depending on the reaction rate of the material gas. Therefore, the chemical reaction of main components of the source gases with one another proceeds around the surface of the first electrode 9, and intermediates with local fluidity created in the process of the chemical reaction stay on the surface of the ferroelectric film 10 for a prolonged period of time. This improves the step coverage of the ferroelectric film 10 over the first electrode 9.

As the ferroelectric film formed in the second embodiment, alternative use is conceivably made of a ferroelectric film made of an SBT ($SrBi_2Ta_2O_9$) film, a ferroelectric film with a Bi-based layered perovskite structure, such as an SrBiTaNb film or a BiLaTa film, or a ferroelectric film made of a PbZrTi film.

Third Embodiment

In the case where the ferroelectric film 10 is deposited by MOCVD on the first electrode 9, we further carried out various studies of the presence or absence of parameters, other than the substrate temperature described above, capable of adjusting components of the ferroelectric film 10 to desired proportions and concurrently capable of improving the step coverage of the ferroelectric film 10 over the first electrode 9. The result of these studies will be described below.

From the further studies, we found another fact that the step coverage of the ferroelectric film 10 over the first electrode 9 is improved if the ferroelectric film 10 is formed under the condition in which the pressure within the chamber (referred hereinafter to as the chamber pressure) is reduced.

A ferroelectric film formation method according to a third embodiment of the present invention will be described below with reference to FIGS. 2, 3, and 5.

Multiple types of source gases constituting a material gas are introduced into the chambers 20 and 30 (see FIGS. 2 and 3) and main components of the source gases are allowed to chemically react with one another under several conditions in which the chamber pressure is $6.99 \times 10^2$ Pa or lower. Then, the ferroelectric film 10 is formed on the surface of the first electrode 9.

The relation in each condition between the chamber pressure and the rate of step coverage of the ferroelectric film 10 over the first electrode 9 will be described below with reference to FIG. 5.

Figure 5:
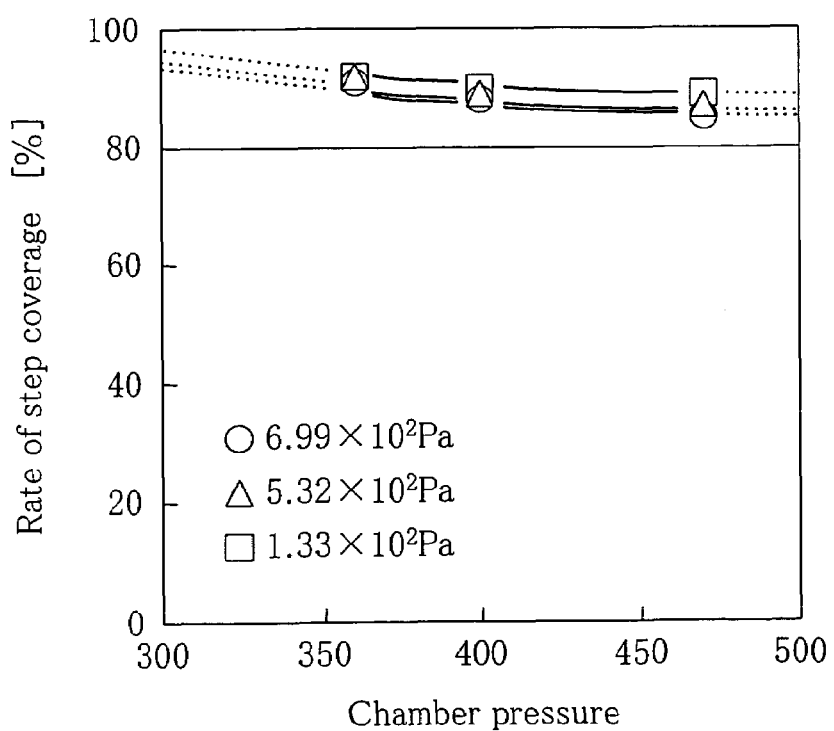
FIG. 5 is a graph showing the relation between the chamber pressure and the rate of step coverage in a ferroelectric film formation method according to a third embodiment of the present invention.

As shown in FIG. 5, it is found that when the ferroelectric film 10 is formed under conditions in which the chamber pressures are $6.99 \times 10^2$ Pa, $5.32 \times 10^2$ Pa, and $1.33 \times 10^2$ Pa, all the ferroelectric films 10 formed under these conditions have rates of step coverage over the first electrode 9 of 80% or more. This leads to one requirement for growth of the ferroelectric film 10. The requirement is to set the chamber pressure at $6.99 \times 10^2$ Pa or lower, thereby improving the step coverage of the ferroelectric film 10 over the first electrode 9.

In contrast to this, although not shown in FIG. 5, if the ferroelectric film 10 is formed under a condition in which the chamber pressure is $1.33 \times 10^3$ Pa or higher, the film grows on the upper portion of the first electrode 9 more than on the lower portion thereof because the chemical reaction for the film growth proceeds depending on the material gas supply rate and because the mean free paths of molecules in the chamber are decreased. Thus, the rate of step coverage of the formed ferroelectric film 10 over the first electrode 9 is 20 to 30%. This fails to form the ferroelectric film 10 having a good step coverage over the first electrode 9.

Next description will be made of the mechanism by which the step coverage of the ferroelectric film 10 formed at a chamber pressure of $6.99 \times 10^2$ Pa or lower is improved.

Since the chamber pressure is reduced, the mean free paths of molecules in the chamber increase to raise the diffusion constants of the multiple types of source gases introduced into the chamber. Also, the chemical reaction for film growth proceeds depending on the reaction rate of the material gas. Therefore, the chemical reaction of main components of the source gases with one another proceeds around the surface of the first electrode 9. This improves the step coverage of the ferroelectric film 10 over the first electrode 9.

The material gas made of multiple types of source gases preferably includes two or more source gases selected from $Sr[Ta(OC_2H_5)_5(OC_2H_4OCH_3)]_2$, $Bi[OC(CH_3)_2(CH_2OCH_3)]_3$, $Ta(OC_2H_5)_5$, $Nb(OC_2H_5)_5$, $La[OC(CH_3)_2(CH_2OCH_3)]_3$, $La(OC_2H_5)_4$, $Ti(OC_2H_5)_4$, and $Ti[OC(CH_3)_2(CH_2OCH_3)]_3$. The material gas with these components employs organometallic solution as the multiple types of source gases, so that the step coverage of the ferroelectric film 10 over the first electrode 9 is further improved.

If the material gas made of multiple types of source gases is a gas mixture composed of a source gas of $Ta(OC_2H_5)_5$ and a source gas of $Sr[Ta(OC_2H_5)_5(OC_2H_4OCH_3)]_2$, the Sr, Bi and Ta proportions of the ferroelectric film are readily controlled as described later.

As is apparent from the above, in the third embodiment, the ferroelectric film 10 is formed under the condition in which the chamber pressure is $6.99 \times 10^2$ Pa or lower. Then, the mean free paths of molecules in the chamber increase to raise the diffusion constants of the multiple types of source gases introduced into the chamber, and the chemical reaction for film growth proceeds depending on the reaction rate of the material gas. Therefore, the chemical reaction of main components of the source gases with one another proceeds around the surface of the first electrode 9. This improves the step coverage of the ferroelectric film 10 over the first electrode 9.

As the ferroelectric film formed in the third embodiment, alternative use is conceivably made of a ferroelectric film made of an SBT ($SrBi_2Ta_2O_9$) film, a ferroelectric film with a Bi-based layered perovskite structure, such as an SrBiTaNb film or a BiLaTa film, or a ferroelectric film made of a PbZrTi film.

Fourth Embodiment

In the case where the ferroelectric film 10 is deposited by MOCVD on the first electrode 9, we still further carried out various studies of the presence or absence of parameters, other than the substrate temperature and the chamber pressure described above, capable of adjusting components of the ferroelectric film 10 to desired proportions and concurrently capable of improving the step coverage of the ferroelectric film 10 over the first electrode 9. The result of these studies will be described below.

From the further studies, we found still another fact that the step coverage of the ferroelectric film 10 over the first electrode 9 is improved if the ferroelectric film 10 is formed under the condition in which the growth rate of the ferroelectric film 10 is lowered.

A ferroelectric film formation method according to a fourth embodiment of the present invention will be described below with reference to FIGS. 2, 3, and 6.

Multiple types of source gases constituting a material gas are introduced into the chambers 20 and 30 (see FIGS. 2 and 3) and main components of the source gases are allowed to chemically react with one another under several conditions in which the growth rate is 7 nm/min or lower. Then, the ferroelectric film 10 is formed on the surface of the first electrode 9.

The relation in each condition between the growth rate and the rate of step coverage of the ferroelectric film 10 over the first electrode 9 will be described below with reference to FIG. 6.

Figure 6:
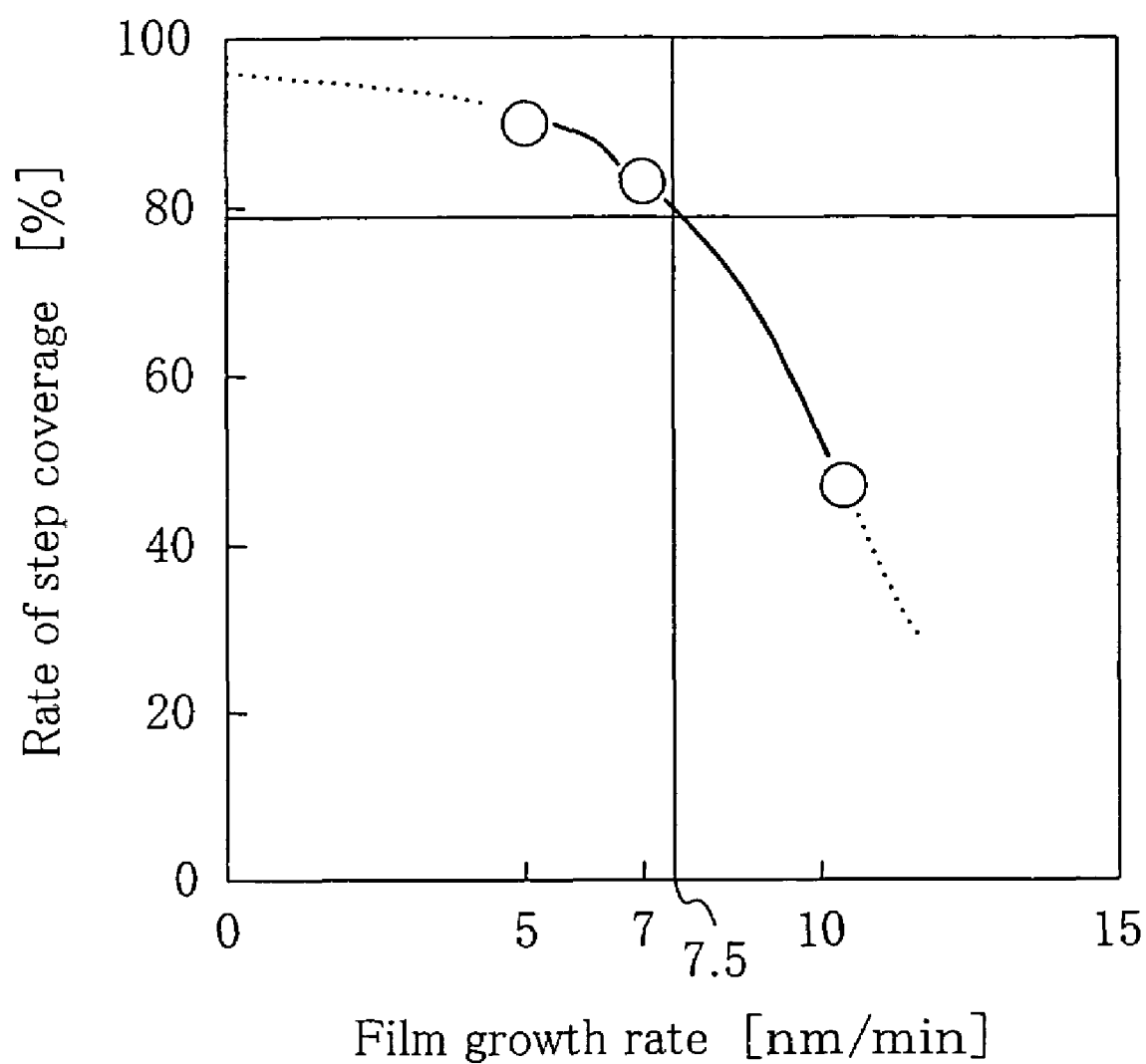
FIG. 6 is a graph showing the relation between the film growth rate and the rate of step coverage in a ferroelectric film formation method according to a fourth embodiment of the present invention.

As shown in FIG. 6, it is found that when the ferroelectric film is formed under conditions in which the growth rates are 5 nm/min, 7 nm/min, and 10.5 nm/min or lower, the ferroelectric films 10 formed under the conditions in which the growth rate is 7 nm/min or lower have rates of step coverage over the first electrode 9 of 80% or more. This leads to one requirement for growth of the ferroelectric film 10. The requirement is to set the growth rate at 7 nm/min or lower, thereby improving the step coverage of the ferroelectric film 10 over the first electrode 9. A growth rate of 7 nm/min or lower can be realized by adjusting the substrate temperature, the chamber pressure, the ratio of flow rate of the material gas, or the like.

In contrast to this, if the growth rate increases beyond around 7.5 nm/min, the rate of step coverage of the ferroelectric film 10 over the first electrode 9 sharply falls. This fails to form the ferroelectric film 10 having a good step coverage over the first electrode 9.

Next description will be made of the mechanism by which the step coverage of the ferroelectric film 10 formed at a growth rate of 7 nm/min or lower is improved.

Since the growth rate is lowered, the chemical reaction for the film growth proceeds in the horizontal growth-dominant region on the electrode surface. Therefore, within the chamber, the ferroelectric film 10 grows horizontally more than vertically, thereby improving the step coverage of the ferroelectric film 10 over the first electrode 9.

The material gas made of multiple types of source gases preferably includes two or more source gases selected from $Sr[Ta(OC_2H_5)_5(OC_2H_4OCH_3)]_2$, $Bi[OC(CH_3)_2(CH_2OCH_3)]_3$, $Ta(OC_2H_5)_5$, $Nb(OC_2H_5)_5$, $La[OC(CH_3)_2(CH_2OCH_3)]_3$, $La(OC_2H_5)_4$, $Ti(OC_2H_5)_4$, and $Ti[OC(CH_3)_2(CH_2OCH_3)]_3$. The material gas with these components employs organometallic solution as the multiple types of source gases, so that the step coverage of the ferroelectric film 10 over the first electrode 9 is further improved.

If the material gas made of multiple types of source gases is a gas mixture composed of a source gas of $Ta(OC_2H_5)_5$ and a source gas of $Sr[Ta(OC_2H_5)_5(OC_2H_4OCH_3)]_2$, the Sr, Bi and Ta proportions of the ferroelectric film are readily controlled as described later.

As is apparent from the above, in the fourth embodiment, the ferroelectric film 10 is formed under the condition in which the growth rate is 7 nm/min or lower, so that the chemical reaction for the film growth proceeds in the horizontal growth-dominant region on the electrode surface. Therefore, within the chamber, the ferroelectric film 10 grows horizontally more than vertically, thereby improving the step coverage of the ferroelectric film 10 over the first electrode 9.

As the ferroelectric film formed in the fourth embodiment, alternative use is conceivably made of a ferroelectric film made of an SBT ($SrBi_2Ta_2O_9$) film, a ferroelectric film with a Bi-based layered perovskite structure, such as an SrBiTaNb film or a BiLaTa film, or a ferroelectric film made of a PbZrTi film.

Fifth Embodiment

A ferroelectric film formation method according to a fifth embodiment of the present invention will be described below with reference to FIG. 7.

Figure 7:
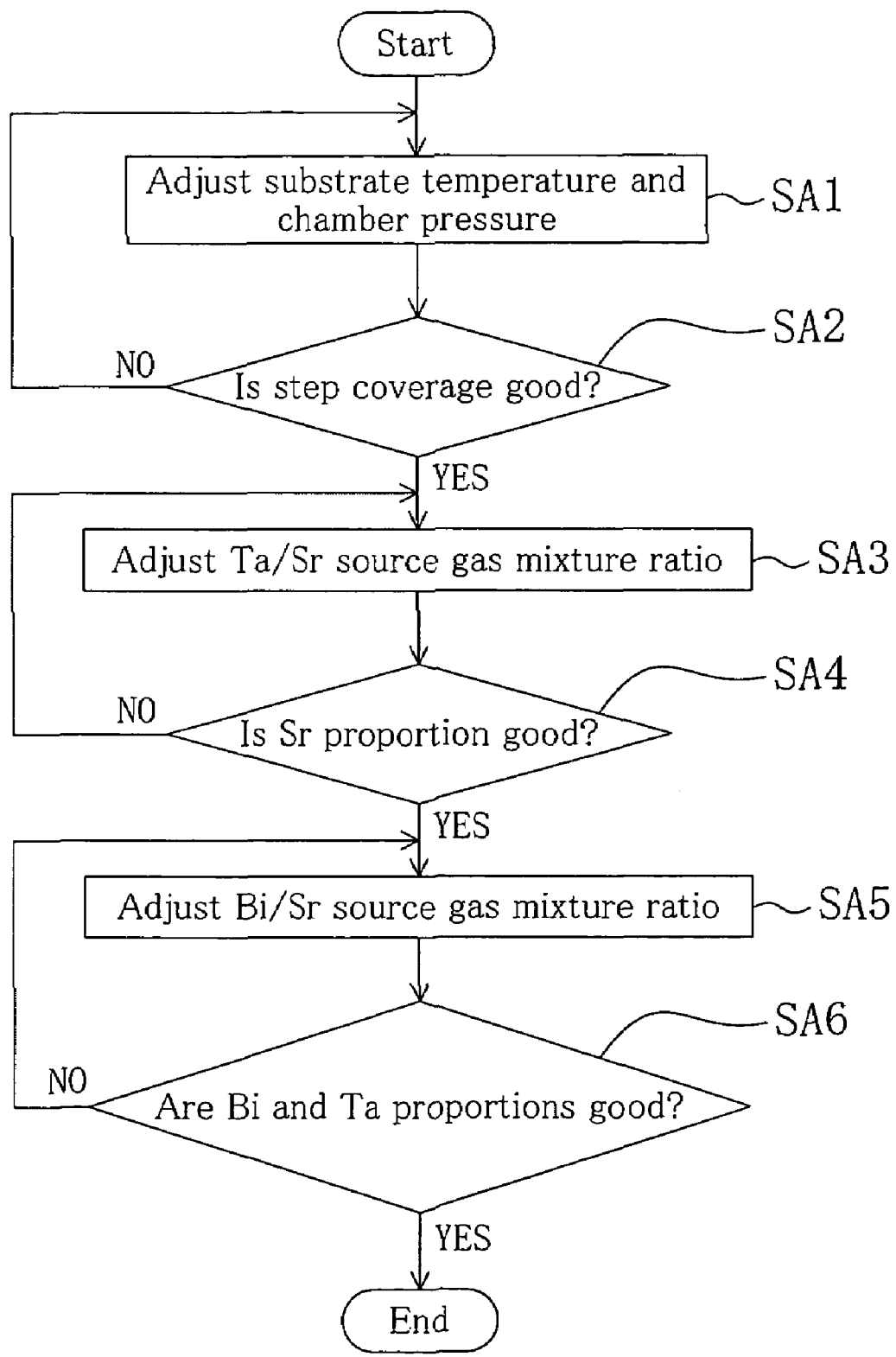
FIG. 7 is a flow chart showing a ferroelectric film formation method according to a fifth embodiment of the present invention.

Referring to FIG. 7, first, in the step SA1, the substrate temperature and the chamber pressure are determined as the film growth condition of the ferroelectric film 10. Then, in the step SA2, judgment is made on whether or not the ferroelectric film 10 has a desired rate of step coverage over the first electrode 9 in the case where the ferroelectric film 10 is formed on the surface of the first electrode 9 at the substrate temperature and the chamber pressure determined in the step SA1. If the ferroelectric film 10 has the desired rate of step coverage over the first electrode 9, the film formation process proceeds to the step SA3. If the ferroelectric film 10 does not have the desired rate of step coverage over the first electrode 9, the process returns to the step SA1 and the above steps are carried out again.

Next, in the step SA3, for a first material gas formed of a gas mixture of a first source gas containing Ta and a second source gas containing Sr, the mixture ratio of the first source gas to the second source gas is adjusted. Then, in the step SA4, judgment is made on whether or not the Sr (metal element constituting an A site) proportion of the ferroelectric film 10 is within a desired proportion range in the case where the first material gas with the mixture ratio adjusted in the step SA3 is introduced into the chamber and the ferroelectric film 10 is formed on the surface of the first electrode 9 at the substrate temperature and the chamber pressure determined in the step SA1. If the Sr proportion of the ferroelectric film 10 is within the desired proportion range, the film formation process proceeds to the step SA5. If the Sr proportion of the ferroelectric film 10 is without the desired proportion range, the process returns to the step SA3 and the above steps are carried out again.

Herein, the experimental result obtained by repeatedly adjusting the mixture ratio of the first source gas to the second source gas as shown in the steps SA3 and SA4 will be described with reference to FIG. 8.

Figure 8:
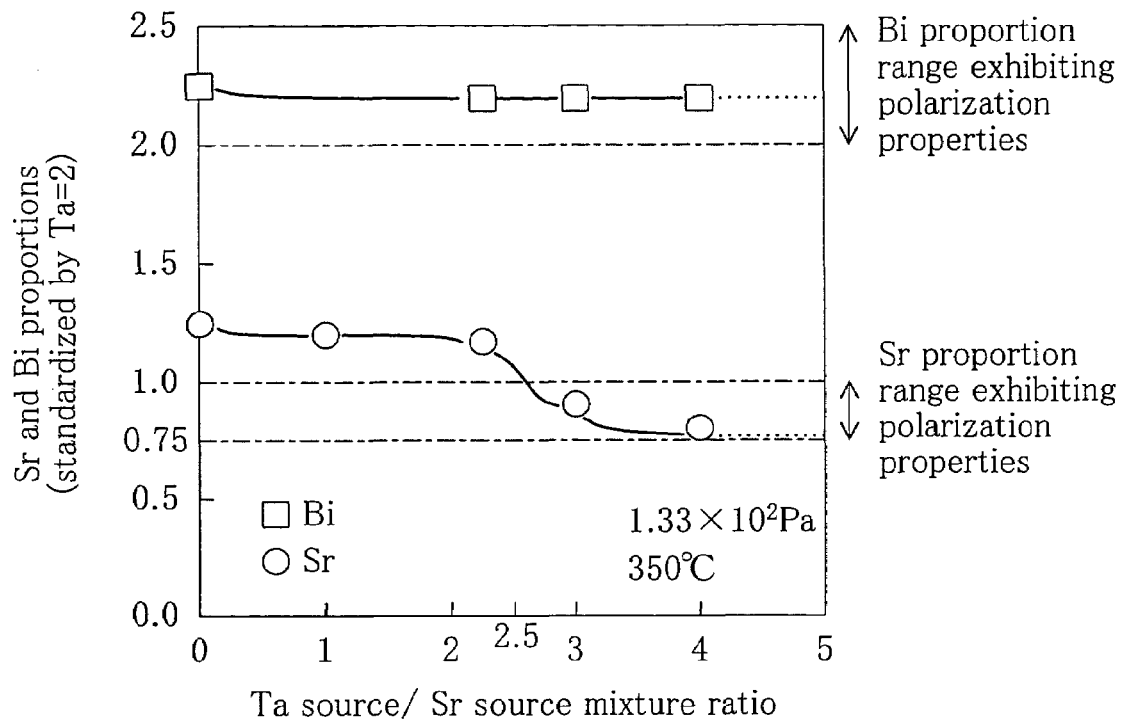
FIG. 8 is a graph showing the relations between the mixture ratio of a Ta source gas to a Sr source gas and the Sr and Bi proportions of a ferroelectric film according to the fifth embodiment of the present invention.

FIG. 8 shows the relations between the mixture ratio of the first source gas to the second source gas and the Sr and Bi proportions of the ferroelectric film 10 in the case where the Ta proportion is standardized by 2.

As shown in FIG. 8, where the substrate temperature and the chamber pressure determined in the step SA1 are 350° C. and $1.33 \times 10^2$ Pa, respectively, the mixture ratio of the first source gas to the second source gas is adjusted with this mixture ratio raised. As a result of this procedure, it is found that when the mixture ratio of the first source gas to the second source gas rises beyond about 2.5, the Sr proportion of the ferroelectric film 10 sharply falls. That is to say, it is found that when the mixture ratio of the first source gas to the second source gas is raised, the Sr proportion of the ferroelectric film 10 alone varies even though the Bi proportion of the ferroelectric film 10 is nearly constant. Therefore, in the step SA3, it is sufficient to adjust the mixture ratio of the first source gas to the second source gas so that the Sr proportion of the ferroelectric film 10 is within a proportion range capable of exhibiting the polarization properties shown in FIG. 8. This in turn provides, in the step SA4, the ferroelectric film 10 with a desired Sr proportion.

Next, in the step SA5, for a second material gas made of a gas mixture of a third source gas containing Bi and a fourth source gas containing Sr, the mixture ratio of the third source gas to the fourth source gas is adjusted under the condition in which the Sr proportion obtained in the steps SA3 and SA4 is kept constant. Thereafter, in the step SA6, judgment is made on whether or not the Bi (metal element constituting a B site) and Ta proportions of the ferroelectric film 10 are within desired proportion ranges in the case where the second material gas with the mixture ratio adjusted in the step SA5 is introduced into the chamber and the ferroelectric film 10 is formed on the surface of the first electrode 9 at the substrate temperature and the chamber pressure determined in the step SA1. If the Bi and Ta proportions of the ferroelectric film 10 are within the desired proportion ranges, a series of procedures mentioned above is completed. If the Bi and Ta proportions of the ferroelectric film 10 are without the desired proportion ranges, the process returns to the step SA5 and the above steps are carried out again.

Herein, the experimental result obtained by repeatedly adjusting the mixture ratio of the third source gas to the fourth source gas as shown in the steps SA5 and SA6 will be described with reference to FIG. 9.

Figure 9:
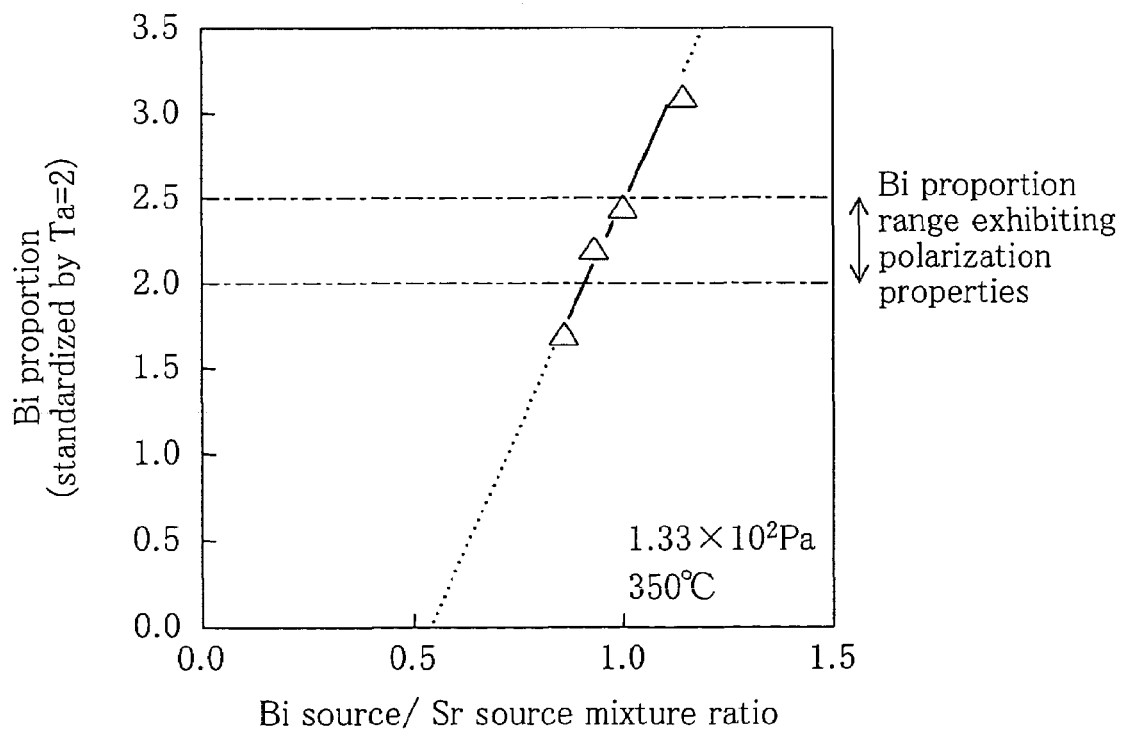
FIG. 9 is a graph showing the relation between the mixture ratio of a Bi source gas to a Sr source gas and the Bi proportion of the ferroelectric film according to the fifth embodiment of the present invention.

FIG. 9 shows the relation between the mixture ratio of the third source gas to the fourth source gas and the Bi proportion of the ferroelectric film 10 in the case where the Ta proportion is standardized by 2.

As shown in FIG. 9, where the substrate temperature and the chamber pressure determined in the step SA1 are 350° C. and $1.33 \times 10^2$ Pa, respectively, the mixture ratio of the third source gas to the fourth source gas is adjusted with this mixture ratio raised. As a result of this procedure, it is found that the Bi proportion of the ferroelectric film 10 linearly increases. Therefore, in the step SA5, it is sufficient to adjust the mixture ratio so that the Bi proportion of the ferroelectric film 10 is within a proportion range capable of exhibiting the polarization properties shown in FIG. 9. This in turn provides, in the step SA6, the ferroelectric film 10 with desired Bi and Ta proportions.

Thus, from the experimental result shown in FIGS. 8 and 9, it is found that when the mixture ratio of the first source gas to the second source gas is increased, the Sr proportion of the ferroelectric film 10 will not be linearly changed but can be independently changed with the mixture ratio of a certain value or more. The parameter for determining the mixture ratio of the first source gas to the second source gas and the mixture ratio of the third source gas to the fourth source gas differs from those for decreasing the substrate temperature, the chamber pressure, and the film growth rate in the second to fourth embodiments described above. From this, the parameter is found to exist which can independently control the mixture ratio of multiple types of source gases constituting the material gas without affecting the rate of step coverage of the ferroelectric film 10 over the first electrode 9. Therefore, as described above, components of the ferroelectric film 10, such as Sr, Bi, and Ta, can be controlled in desired proportions.

Moreover, decreases in temperature, pressure, film growth rate, and the like of the film formation conditions for MOCVD described in the second to fourth embodiments can also be used in the fifth embodiment to form a ferroelectric BLT film having a good step coverage and good polarization properties.

The first source gas described using FIGS. 8 and 9 is preferably made of $Ta(OC_2H_5)_5$, and the second source gas is preferably made of $Sr[Ta(OC_2H_5)_5(OC_2H_4OCH_3)]_2$.

In an exemplary case where the first ferroelectric film formation system shown in FIG. 2 is used to form the ferroelectric film 10, the growth condition of the ferroelectric film 10 and the source gases introduced into the chamber 20 can be obtained from a series of steps mentioned above. The obtained result is shown in the following Table 1.

TABLE 1

| ITEM | SET VALUE |
|---|---|
| Sr/Ta gas mixture | 0.275 [ml/min (in a normal state)] |
| Sr source gas:Ta source gas | 1:3 |
| Bi source gas | 0.24 [ml/min (in a normal state)] |
| Oxygen gas | 1 [l/min (in a normal state)] |
| Substrate temperature | 350 [° C.] |
| Chamber pressure | $1.33 \times 10^2$ [Pa] |
| Gasification temperature of source gases | 200 [° C.] |

Hereinafter, a formation method of the ferroelectric film 10 using the first ferroelectric film formation system under the condition shown in Table 1 will be concretely described with reference to FIGS. 2, 10 and 11.

First, as shown in FIG. 2, the semiconductor substrate 21 is mounted on the susceptor 22 within the chamber 20. The semiconductor substrate 21 is heated with a heater inside the susceptor 22 to have a substrate temperature of 350° C.

Subsequently, an Sr/Ta gas mixture made by mixing a source gas containing Sr and a source gas containing Ta in proportions of 1:3 is introduced into the chamber 20 at a flow rate of 0.275 ml/min (in a normal state), and a source gas containing Bi is introduced into the chamber 20 at a flow rate of 0.24 ml/min (in a normal state). Although not shown, the source gases are gasified with a gasification unit and the gasification temperatures thereof are 200° C. Oxygen gas as an oxidizing agent is also introduced into the chamber 20 at a flow rate of 1.0 l/min (in a normal state). The chamber pressure is set at $1.33 \times 10^2$ Pa. Under such a condition, main components of the Sr/Ta gas mixture, the source gas containing Bi, and the oxygen gas are allowed to chemically react with one another, thereby depositing the ferroelectric film 10 on the semiconductor substrate 21. Note that the ferroelectric film 10 is annealed for the purpose of subjecting heat treatment. This annealing is performed using, for example, RTA (rapid thermal annealing) at an annealing temperature of 600° C. for one minute in an oxygen atmosphere.

Finally, the semiconductor substrate 21 with the ferroelectric film 10 formed is removed from the susceptor 22 and then formation of the ferroelectric film 10 is completed.

The step coverage and the polarization properties of the ferroelectric film 10 thus formed will be described with reference to FIGS. 10 and 11.

Figure 10:
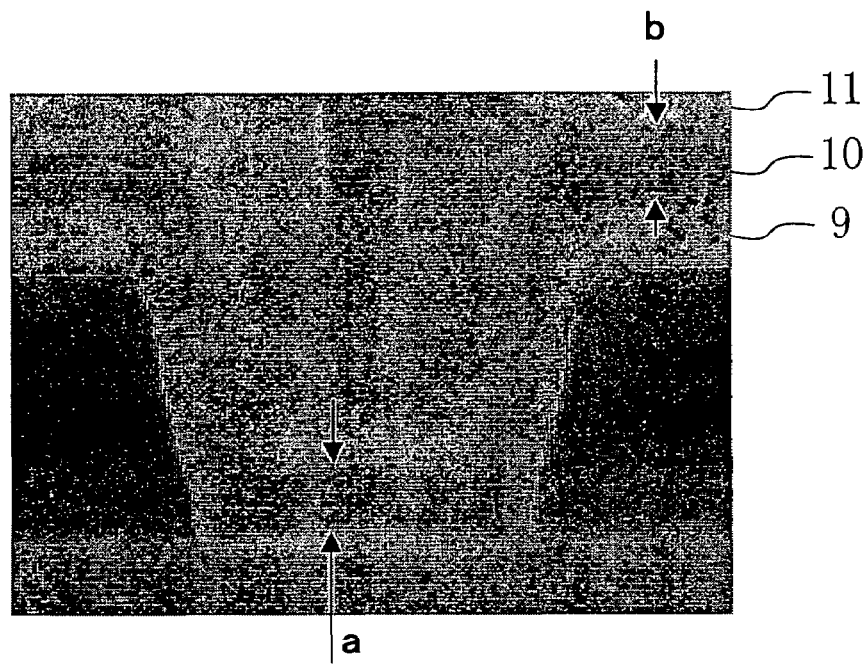
FIG. 10 is a SEM image view showing a cross section of the ferroelectric film formed by the ferroelectric film formation method according to the fifth embodiment of the present invention.

As shown in FIG. 10, the rate of step coverage of the ferroelectric film 10 over the first electrode 9 is obtained from the SEM image view of the ferroelectric film 10 having an aspect ratio of 2.0. From the obtained result, the rate of step coverage is found to reach 85%. Therefore, the ferroelectric film 10 with an excellent step coverage over the first electrode 9 is attained.

Figure 11:
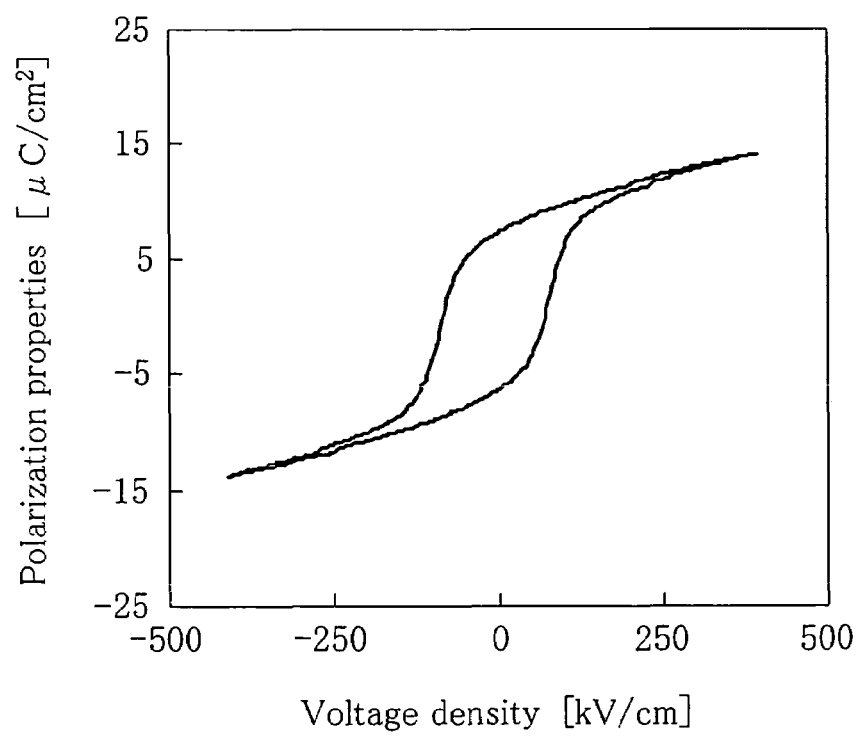
FIG. 11 is a graph showing the polarization properties of the ferroelectric film formed by the ferroelectric film formation method according to the fifth embodiment of the present invention.

As shown in FIG. 11, from the evaluation of polarization properties of the ferroelectric film 10, the polarization properties of the ferroelectric film 10 are found to reach 15 $\mu C/cm^2$. Therefore, the ferroelectric film 10 even with excellent polarization properties is attained.

Moreover, the ferroelectric film 10 formed in the manner mentioned above is analyzed. The analysis result is as follows: the Sr proportion is 15.2%, the Bi proportion is 44.4%, the Ta proportion is 40.4%, and the ferroelectric film 10 is composed in proportions of nearly Sr:Bi:Ta=1:2:2. Thus, the ferroelectric film containing components in desired proportions is attained.

As is apparent from the above, with the fifth embodiment, the ferroelectric film 10 can be formed which has an excellent step coverage over the first electrode 9. Moreover, the mixture ratio of the multiple types of source gases constituting the material gas can be determined by a simple approach to form the ferroelectric film containing components in desired proportions.

In the fifth embodiment, description has been made of the ferroelectric film 10 formed of an SBT ($SrBi_2Ta_2O_9$) film. Alternatively, the ferroelectric film 10 may be made of a ferroelectric film with a Bi-based layered perovskite structure, such as an SrBiTaNb film or a BiLaTa film, or a ferroelectric film made of a PbZrTi film.

In the fifth embodiment, description has been made of the ferroelectric film formation method using the first ferroelectric film formation system under the condition shown in the Table 1. Alternatively, the second ferroelectric film formation system may be used.

Sixth Embodiment

A ferroelectric film formation method according to a sixth embodiment of the present invention will be described below with reference to FIG. 12.

Figure 12:
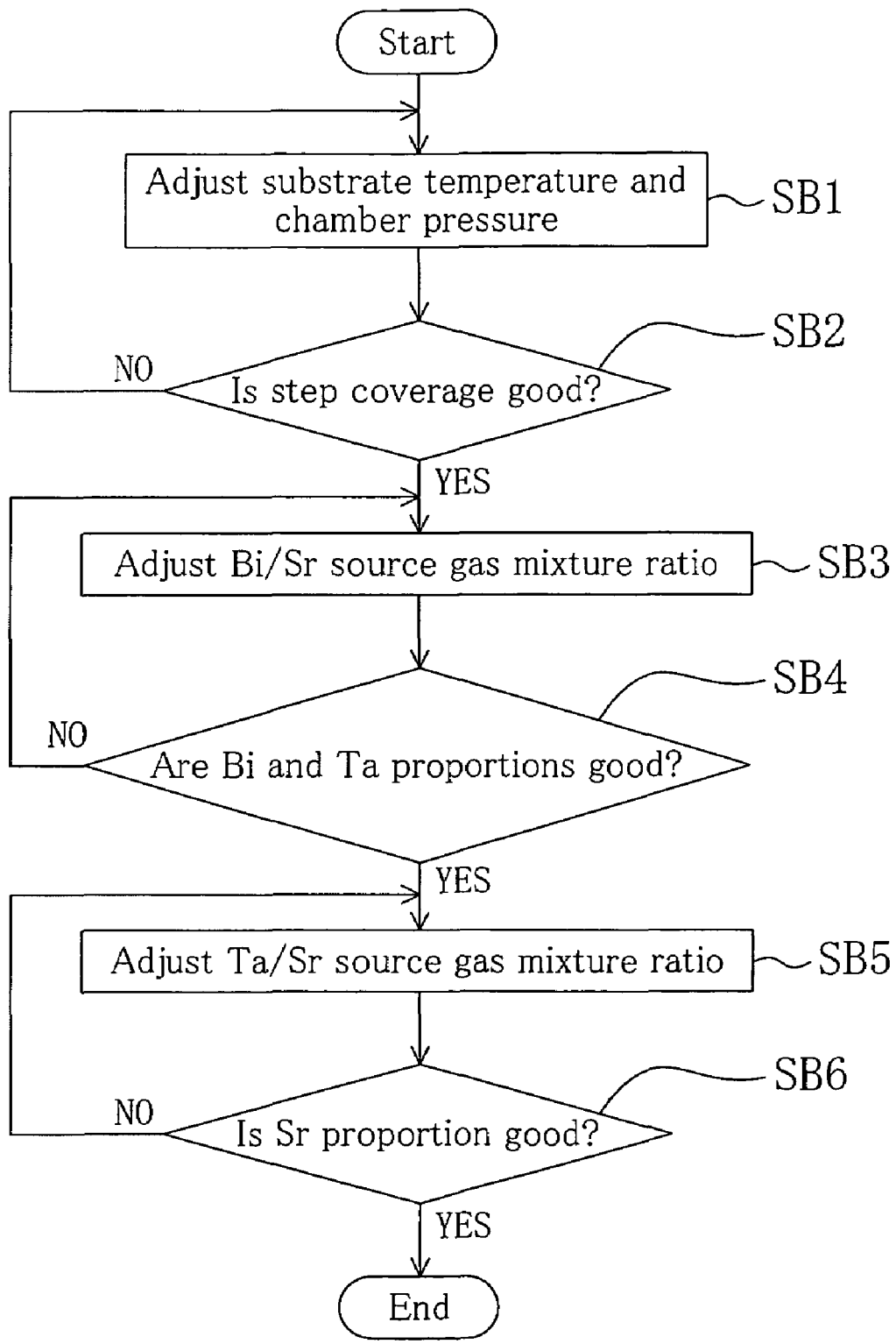
FIG. 12 is a flow chart showing a ferroelectric film formation method according to a sixth embodiment of the present invention.

Referring to FIG. 12, first, in the step SB1, the substrate temperature and the chamber pressure are determined as the growth condition of the ferroelectric film 10. Then, in the step SB2, judgment is made on whether or not the ferroelectric film 10 has a desired rate of step coverage over the first electrode 9 in the case where the ferroelectric film 10 is formed on the surface of the first electrode 9 at the substrate temperature and the chamber pressure determined in the step SB1. If the ferroelectric film 10 has the desired rate of step coverage over the first electrode 9, the film formation process proceeds to the step SB3. If the ferroelectric film 10 does not have the desired rate of step coverage over the first electrode 9, the process returns to the step SB1 and the above steps are carried out again.

Next, in the step SB3, for a first material gas formed of a gas mixture of a third source gas containing Bi and a fourth source gas containing Sr, the mixture ratio of the third source gas to the fourth source gas is adjusted. Then, in the step SB4, judgment is made on whether or not the Bi (metal element constituting a B site) and Ta proportions of the ferroelectric film 10 are within desired proportion ranges in the case where the first material gas with the mixture ratio adjusted in the step SB3 is introduced into the chamber and the ferroelectric film 10 is formed on the surface of the first electrode 9 at the substrate temperature and the chamber pressure determined in the step SB1. If the Bi and Ta proportions of the ferroelectric film 10 are within the desired proportion ranges, the film formation process proceeds to the step SB5. If the Bi and Ta proportions of the ferroelectric film 10 are without the desired proportion ranges, the process returns to the step SB3 and the above steps are carried out again.

Note that the mixture ratio of the third source gas to the fourth source gas mentioned in the steps SB3 and SB4 can be adjusted in a similar way to the description of the fifth embodiment referring to FIG. 9.

Next, in the step SB5, for a second material gas made of a gas mixture of a first source gas containing Ta and a second source gas containing Sr, the mixture ratio of the first source gas to the second source gas is adjusted under the condition where the Bi proportion obtained in the steps SB3 and SB4 is kept constant. Thereafter, in the step SB6, judgment is made on whether or not the Sr (metal element constituting an A site) proportion of the ferroelectric film 10 is within a desired proportion range in the case where the second material gas with the mixture ratio adjusted in the step SB5 is introduced into the chamber and the ferroelectric film 10 is formed on the surface of the first electrode 9 at the substrate temperature and the chamber pressure determined in the step SB1. If the Sr proportion of the ferroelectric film 10 is within the desired proportion range, a series of procedures mentioned above is completed. If the Sr proportion of the ferroelectric film 10 is without the desired proportion range, the process returns to the step SB5 and the above steps are carried out again.

Note that the mixture ratio of the first source gas to the second source gas mentioned in the steps SB5 and SB6 can be adjusted in a similar way to the description of the fifth embodiment referring to FIG. 8. Moreover, decreases in temperature, pressure, film growth rate, and the like of the film formation conditions for MOCVD described in the second to fourth embodiments can also be used in the sixth embodiment to form a ferroelectric BLT film having a good step coverage and good polarization properties. In addition, the first source gas is preferably made of $Ta(OC_2H_5)_5$ and the second source gas is preferably made of $Sr[Ta(OC_2H_5)_5(OC_2H_4OCH_3)]_2$.

In an exemplary case where the second ferroelectric film formation system shown in FIG. 3 is used to form the ferroelectric film 10, the growth condition of the ferroelectric film 10 and the source gases introduced into the chamber 30 can be obtained from a series of steps mentioned above. The obtained result is shown in the following Table 2.

TABLE 2

| ITEM | SET VALUE |
| --- | --- |
| Sr source gas | 0.07 [ml/min (in a normal state)] |
| Ta source gas | 0.03 [ml/min (in a normal state)] |
| Bi source gas | 0.08 [ml/min (in a normal state)] |
| Oxygen gas | 1.23 [l/min (in a normal state)] |
| Substrate temperature | 350 [° C.] |
| Chamber pressure | $1.33 \times 10^2$ [Pa] |
| Gasification temperature of source gases | 250 [° C.] |

Hereinafter, a ferroelectric film formation method using the second ferroelectric film formation system under the condition shown in Table 2 will be concretely described with reference to FIGS. 3, 13 and 14.

First, as shown in FIG. 3, the semiconductor substrate 31 is mounted on the susceptor 32 within the chamber 30. The semiconductor substrate 31 is heated with a heater inside the susceptor 32 to have a substrate temperature of 350° C.

Subsequently, source gases containing Sr, Ta and Bi are introduced into the chamber 30 at flow rates of 0.07 ml/min (in a normal state), 0.03 ml/min (in a normal state), and 0.08 ml/min (in a normal state), respectively. Although not shown, the source gases are gasified with a gasification unit and the gasification temperatures thereof are 250° C. Oxygen gas as an oxidizing agent is also introduced into the chamber 30 at a flow rate of 1.23 l/min (in a normal state). The chamber pressure is set at $1.33 \times 10^2$ Pa. Under such a condition, main components of the source gas containing Sr, the source gas containing Ta, the source gas containing Bi, and the oxygen gas are allowed to chemically react with one another, thereby depositing the ferroelectric film 10 on the semiconductor substrate 31. Note that the ferroelectric film 10 is annealed for the purpose of subjecting heat treatment. This annealing is performed using, for example, RTA (rapid thermal annealing) at an annealing temperature of 600° C. for one minute in an oxygen atmosphere.

Finally, the semiconductor substrate 31 with the ferroelectric film 10 formed is removed from the susceptor 32 and then formation of the ferroelectric film 10 is completed.

The step coverage and the polarization properties of the ferroelectric film 10 thus formed will be described with reference to FIGS. 13 and 14.

Figure 13:
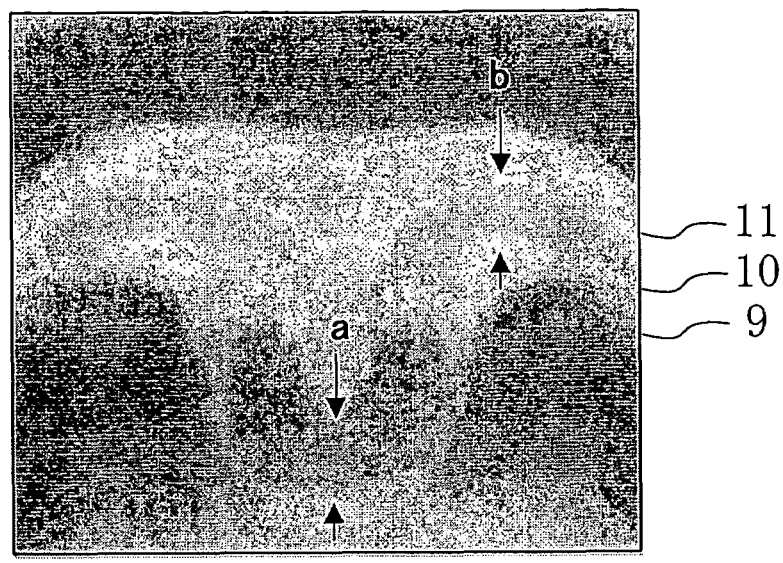
FIG. 13 is a SEM image view showing a cross section of a ferroelectric film formed by the ferroelectric film formation method according to the sixth embodiment of the present invention.

As shown in FIG. 13, the rate of step coverage of the ferroelectric film 10 over the first electrode 9 is obtained from the SEM image view of the ferroelectric film 10 having an aspect ratio of 2.0. From the obtained result, the rate of step coverage is found to reach 90%. Therefore, the ferroelectric film 10 with an excellent step coverage over the first electrode 9 is attained.

Figure 14:
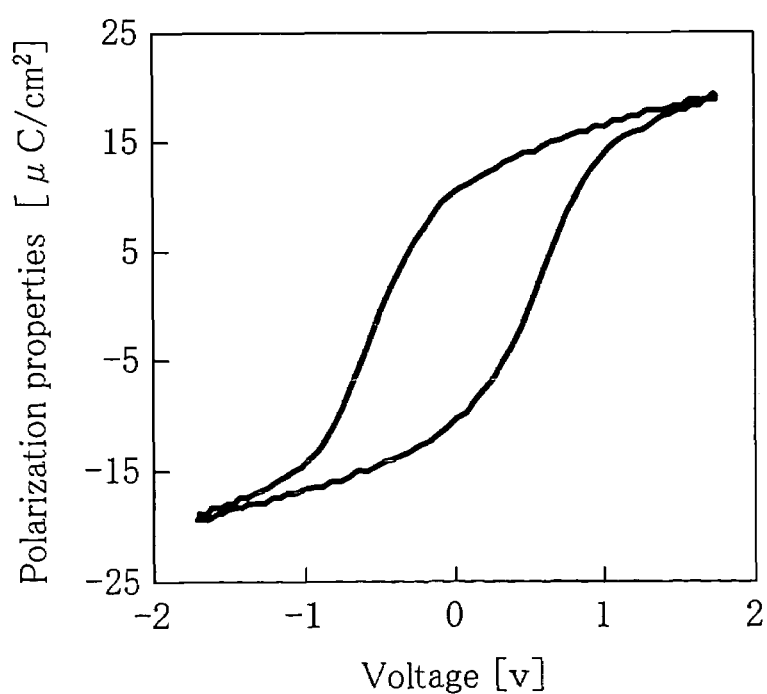
FIG. 14 is a graph showing the polarization properties of the ferroelectric film formed by the ferroelectric film formation method according to the sixth embodiment of the present invention.

As shown in FIG. 14, from the evaluation of polarization properties of the ferroelectric film 10, the polarization properties of the ferroelectric film 10 are found to reach 20 $\mu C/cm^2$. Therefore, the ferroelectric film 10 even with excellent polarization properties is attained.

Moreover, the ferroelectric film 10 formed in the manner mentioned above is analyzed. The analysis result is as follows: the Sr proportion is 16.3%, the Bi proportion is 42.9%, the Ta proportion is 40.8%, and the ferroelectric film 10 is composed in proportions of nearly Sr:Bi:Ta=1:2:2. Thus, the ferroelectric film 10 containing components in desired proportions is attained.

Thus, even though not the first ferroelectric film formation system used in fifth embodiment but the second ferroelectric film formation system is used in the sixth embodiment, as described above, the ferroelectric film 10 can be formed which has an excellent step coverage over the first electrode 9 and contains components in desired proportions.

As is apparent from the above, with the sixth embodiment, the ferroelectric film 10 can be formed which has an excellent step coverage over the first electrode 9. Moreover, the mixture ratio of the multiple types of source gases constituting the material gas can be determined by a simple approach to form the ferroelectric film containing components in desired proportions.

In the sixth embodiment, description has been made of the ferroelectric film made of an SBT ($SrBi_2Ta_2O_9$) film. Alternatively, the ferroelectric film may be made of a ferroelectric film with a Bi-based layered perovskite structure, such as an SrBiTaNb film or a BiLaTa film, or a ferroelectric film made of a PbZrTi film.

In the sixth embodiment, description has been made of the formation method of the ferroelectric film 10 using the second ferroelectric film formation system under the condition shown in the Table 2. Alternatively, the first ferroelectric film formation system may be used.

Seventh Embodiment

A ferroelectric film formation method according to a seventh embodiment of the present invention will be described below with reference to FIG. 15.

Figure 15:
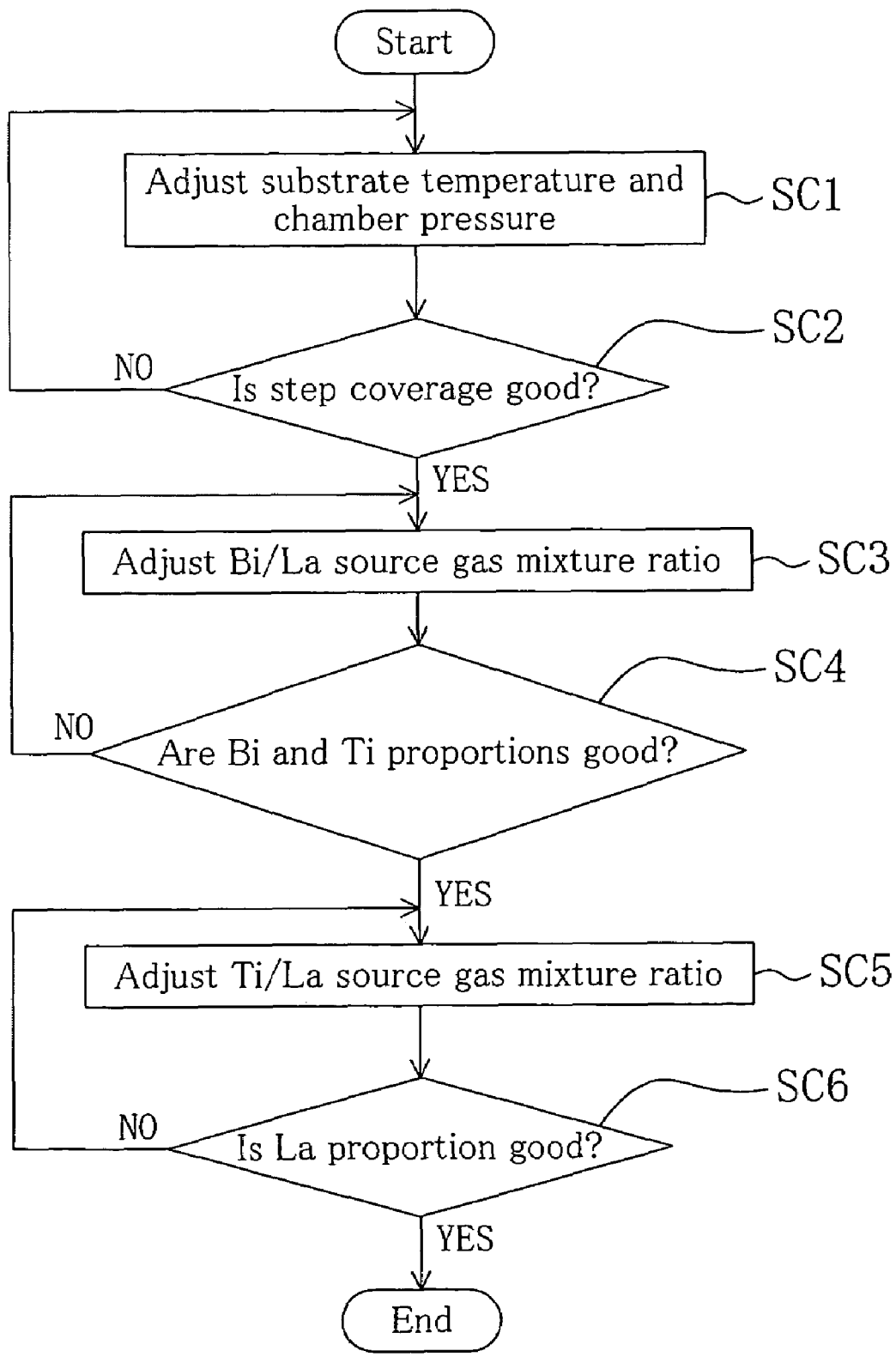
FIG. 15 is a flow chart showing a ferroelectric film formation method according to a seventh embodiment of the present invention.

Referring to FIG. 15, first, in the step SC1, the substrate temperature and the chamber pressure are determined as the growth condition of the ferroelectric film 10. Then, in the step SC2, judgment is made on whether or not the ferroelectric film 10 has a desired rate of step coverage over the first electrode 9 in the case where the ferroelectric film 10 is formed on the surface of the first electrode 9 at the substrate temperature and the chamber pressure determined in the step SC1. If the ferroelectric film 10 has the desired rate of step coverage over the first electrode 9, the film formation process proceeds to the step SC3. If the ferroelectric film 10 does not have the desired rate of step coverage over the first electrode 9, the process returns to the step SC1 and the above steps are carried out again.

Next, in the step SC3, for a first material gas made of a gas mixture of a first source gas containing Bi and a second source gas containing La, the mixture ratio of the first source gas to the second source gas is adjusted. Thereafter, in the step SC4, judgment is made on whether or not the Bi (metal element constituting an A site) and Ti proportions of the ferroelectric film 10 are within desired proportion ranges in the case where the first material gas with the mixture ratio adjusted in the step SC3 is introduced into the chamber and the ferroelectric film 10 is formed on the surface of the first electrode 9 at the substrate temperature and the chamber pressure determined in the step SC1. If the Bi and Ti proportions of the ferroelectric film 10 are within the desired proportion ranges, the film formation process proceeds to the step SC5. If the Bi and Ti proportions of the ferroelectric film 10 are without the desired proportion ranges, the process returns to the step SC3 and the above steps are carried out again.

Herein, the experimental result obtained by repeatedly adjusting the mixture ratio of the first source gas to the second source gas as shown in the steps SC3 and SC4 will be described with reference to FIG. 16.

Figure 16:
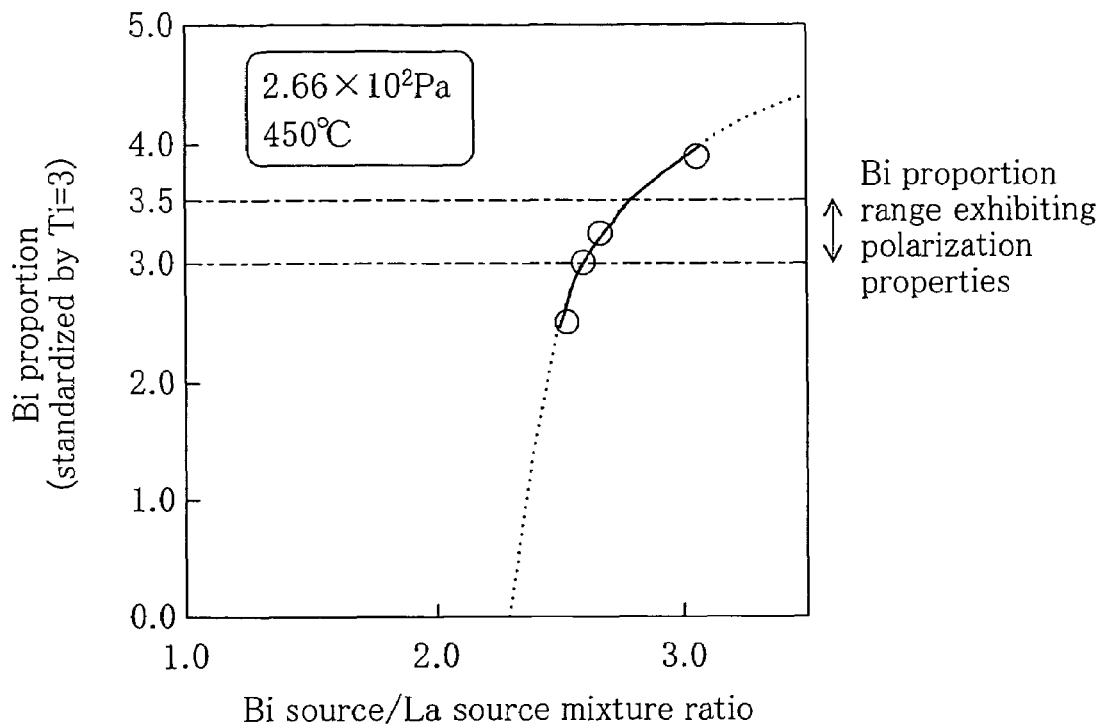
FIG. 16 is a graph showing the relation between the mixture ratio of a Bi source gas to a La source gas and the Bi proportion of a ferroelectric film according to the seventh embodiment of the present invention.

FIG. 16 shows the relation between the mixture ratio of the first source gas to the second source gas and the Bi proportion of the ferroelectric film 10 in the case where the Ti proportion is standardized by 3.

As shown in FIG. 16, where the substrate temperature and the chamber pressure determined in the step SC1 are 450° C. and $2.66 \times 10^2$ Pa, respectively, the mixture ratio of the first source gas to the second source gas is adjusted with this mixture ratio raised. As a result of this procedure, it is found that the Bi proportion of the ferroelectric film 10 up to about 3.5 linearly increases and the Bi proportion thereof beyond about 3.5 nonlinearly increases. Therefore, in the step SC3, it is sufficient to adjust the mixture ratio so that the Bi proportion of the ferroelectric film 10 is within a proportion range capable of exhibiting the polarization properties shown in FIG. 16. This in turn provides, in the step SC4, the ferroelectric film 10 with desired Bi and Ti proportions.

Next, in the step SC5, for a second material gas formed of a gas mixture of a third source gas containing Ti and a fourth source gas containing La, the mixture ratio of the third source gas to the fourth source gas is adjusted under the condition in which the Bi proportion obtained in the steps SC3 and SC4 is kept constant. Then, in the step SC6, judgment is made on whether or not the La (metal element constituting a B site) proportion of the ferroelectric film 10 is within a desired proportion range in the case where the second material gas with the mixture ratio adjusted in the step SC5 is introduced into the chamber and the ferroelectric film 10 is formed on the surface of the first electrode 9 at the substrate temperature and the chamber pressure determined in the step SC1. If the La proportion of the ferroelectric film 10 is within the desired proportion range, a series of procedures mentioned above is completed. If the La proportion of the ferroelectric film 10 is without the desired proportion range, the process returns to the step SC5 and the above steps are carried out again.

Herein, the experimental result obtained by repeatedly adjusting the mixture ratio of the third source gas to the fourth source gas as shown in the steps SC5 and SC6 will be described with reference to FIG. 17.

Figure 17:
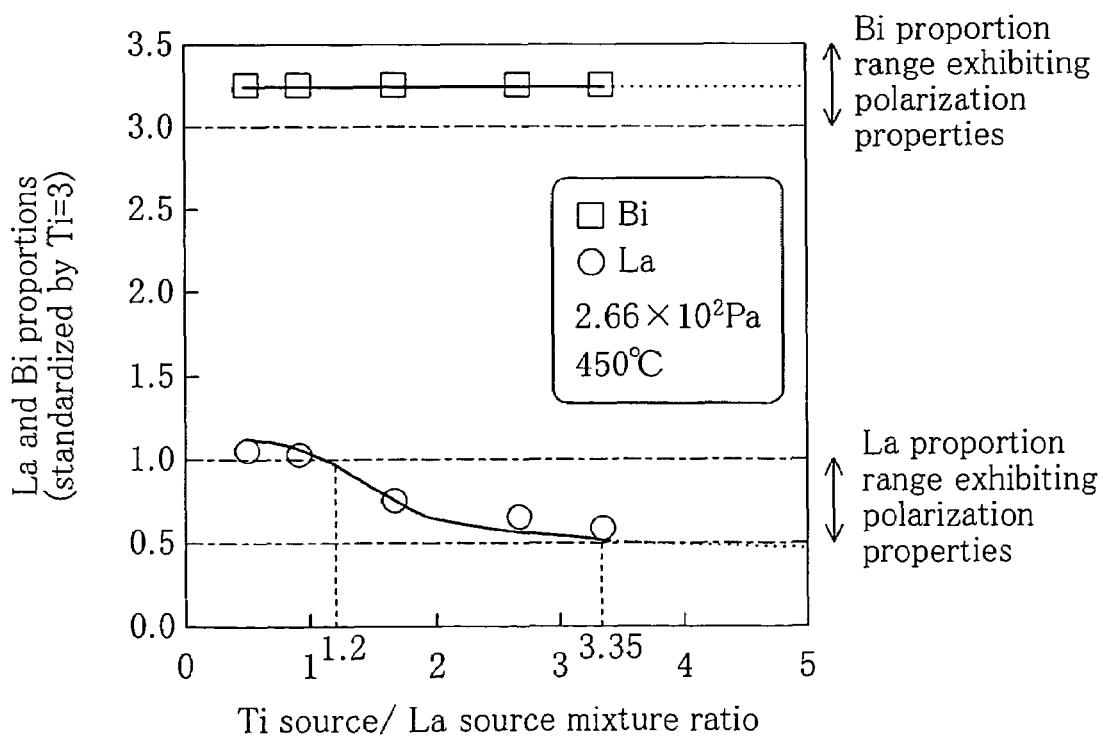
FIG. 17 is a graph showing the relations between the mixture ratio of a Ti source gas to a La source gas and the La and Bi proportions of the ferroelectric film according to the seventh embodiment of the present invention.

FIG. 17 shows the relations between the mixture ratio of the third source gas to the fourth source gas and the La and Bi proportions of the ferroelectric film 10 in the case where the Ti proportion is standardized by 3.

As shown in FIG. 17, where the substrate temperature and the chamber pressure determined in the step SC1 are 450° C. and $2.66 \times 10^2$ Pa, respectively, the mixture ratio of the third source gas to the fourth source gas is adjusted with this mixture ratio raised. As a result of this procedure, it is found that when the mixture ratio of the third source gas to the fourth source gas increases beyond about 1.2, the La proportion of the ferroelectric film 10 sharply falls. That is to say, it is found that when the mixture ratio of the third source gas to the fourth source gas is increased, the La proportion of the ferroelectric film 10 alone varies even though the Bi proportion of the ferroelectric film 10 is nearly constant. Therefore, in the step SC5, it is sufficient to adjust the mixture ratio of the third source gas to the fourth source gas so that the La proportion of the ferroelectric film 10 is within a proportion range capable of exhibiting the polarization properties shown in FIG. 17. This in turn provides, in the step SC6, the ferroelectric film 10 with a desired La proportion.

Thus, from the experimental result shown in FIGS. 16 and 17, it is found that when the mixture ratio of the first source gas to the second source gas is increased, the La proportion of the ferroelectric film 10 will not be linearly changed but can be independently changed with the mixture ratio beyond a certain value. The parameter for determining the mixture ratio of the first source gas to the second source gas and the mixture ratio of the third source gas to the fourth source gas differs from those for decreasing the substrate temperature, the chamber pressure, and the film growth rate in the second to fourth embodiments described above. From this, the parameter is found to exist which can independently control the mixture ratio of multiple types of source gases constituting the material gas without affecting the rate of step coverage of the ferroelectric film 10 over the first electrode 9. Therefore, as described above, components of the ferroelectric film 10, such as Bi, La, and Ti, can be controlled in desired proportions.

Moreover, decreases in temperature, pressure, film growth rate, and the like of the film formation conditions for MOCVD described in the second to fourth embodiments can also be used in the seventh embodiment to form a ferroelectric BLT film having a good step coverage and good polarization properties.

In the seventh embodiment, as shown in FIG. 15, description has been made of the case where desired Bi and Ti proportions are obtained in the steps SC3 and SC4 and then a desired La proportion is obtained in the steps SC5 and SC6. It is alternatively acceptable that a desired La proportion is obtained and then desired Bi and Ti proportions are obtained. That is to say, it is alternatively acceptable that subsequently to the step SC2, the steps SC5 and SC6 are conducted and then the steps SC3 and SC4 are conducted.

In an exemplary case where the first or second ferroelectric film formation system shown in FIG. 2 or 3 is used to form the ferroelectric film 10, the growth condition of the ferroelectric film 10 and the source gases introduced into the chamber 20 or 30 can be obtained from a series of steps mentioned above. The obtained result is shown in the following Table 3.

TABLE 3

| ITEM | SET VALUE |
| --- | --- |
| La source gas | 0.03 [ml/min (in a normal state)] |
| Ti source gas | 0.05 [ml/min (in a normal state)] |
| Bi source gas | 0.08 [ml/min (in a normal state)] |
| Oxygen gas | 1.50 [l/min (in a normal state)] |
| Substrate temperature | 450 [° C.] |
| Chamber pressure | $2.66 \times 10^2$ [Pa] |
| Gasification temperature of source gases | 300 [° C.] |

Hereinafter, a formation method of the ferroelectric film 10 exemplarily using the first ferroelectric film formation system under the condition shown in Table 3 will be concretely described with reference to FIGS. 2 and 18.

First, as shown in FIG. 2, the semiconductor substrate 21 is mounted on the susceptor 22 within the chamber 20. The semiconductor substrate 21 is heated with a heater inside the susceptor 22 to have a substrate temperature of 450° C. or lower.

Subsequently, multiple types of material gases are introduced into the chamber 20. For example, a gas mixture is introduced which is made by mixing 0.03 ml/min (in a normal state) of La(OC$_2$H$_5$)$_4$ as a source gas containing La, 0.05 ml/min (in a normal state) of Ti(OC$_2$H$_5$)$_4$ as a source gas containing Ti, and 0.08 ml/min (in a normal state) of Bi[OC(CH$_3$)$_2$(CH$_2$OCH$_3$)]$_3$ as a source gas containing Bi. Although not shown, the source gases are gasified with a gasification unit and the gasification temperatures thereof are 300° C. Oxygen gas as an oxidizing agent is also introduced into the chamber 20 at a flow rate of 1.5 l/min (in a normal state). The chamber pressure is set at 2.66×10$^2$ Pa. Under such a condition, the multiple types of source gases are allowed to chemically react with one another, thereby depositing the ferroelectric film 10 on the semiconductor substrate 21. Note that the ferroelectric film 10 is annealed for the purpose of subjecting heat treatment. This annealing is performed using, for example, RTA (rapid thermal annealing) at an annealing temperature of 600° C. for one minute in an oxygen atmosphere.

Finally, the semiconductor substrate 21 with the ferroelectric film 10 formed is removed from the susceptor 22 and then formation of the ferroelectric film 10 is completed.

The polarization properties of the ferroelectric film 10 thus formed will be described with reference to FIG. 18.

Figure 18:
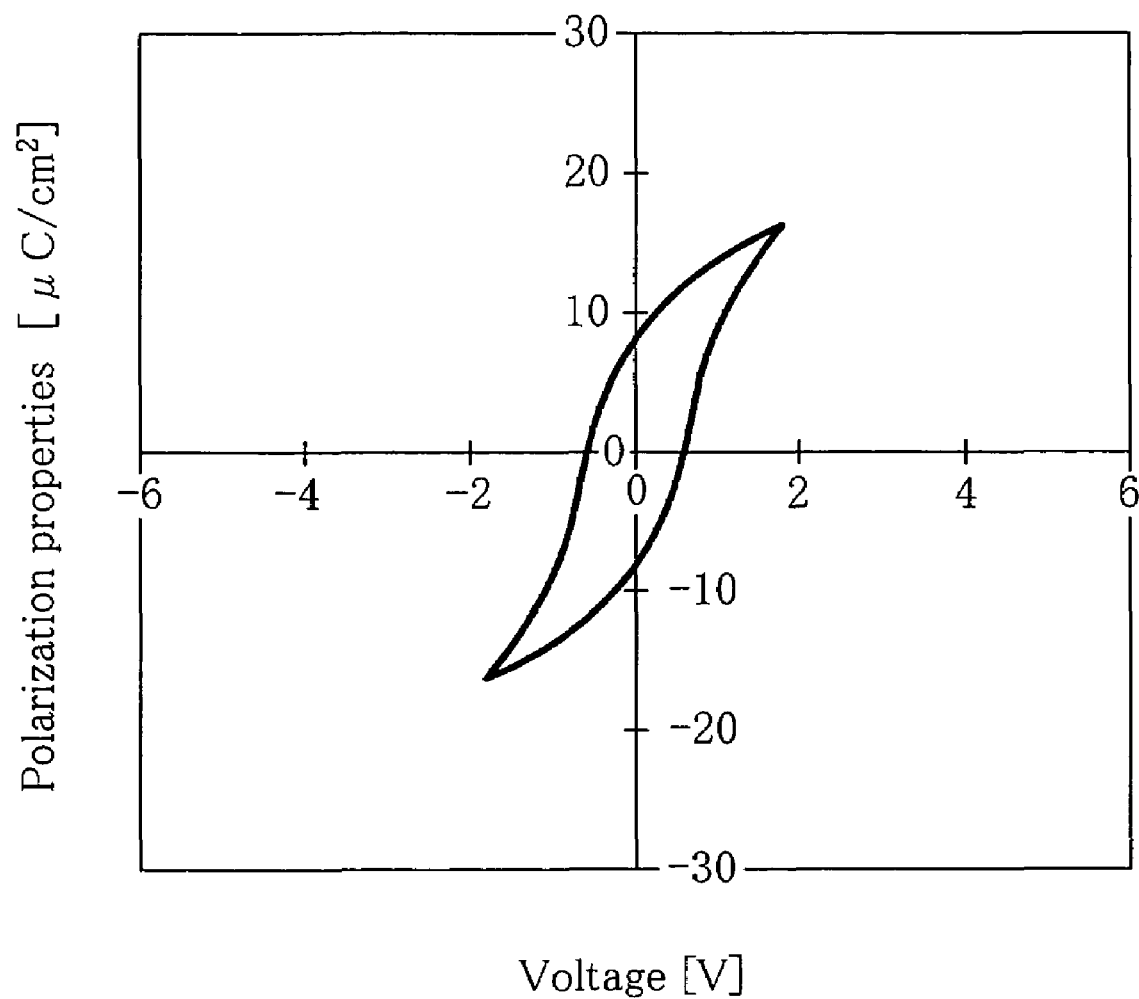
FIG. 18 is a graph showing the polarization properties of the ferroelectric film formed by the ferroelectric film formation method according to the seventh embodiment of the present invention.
Figure 19:
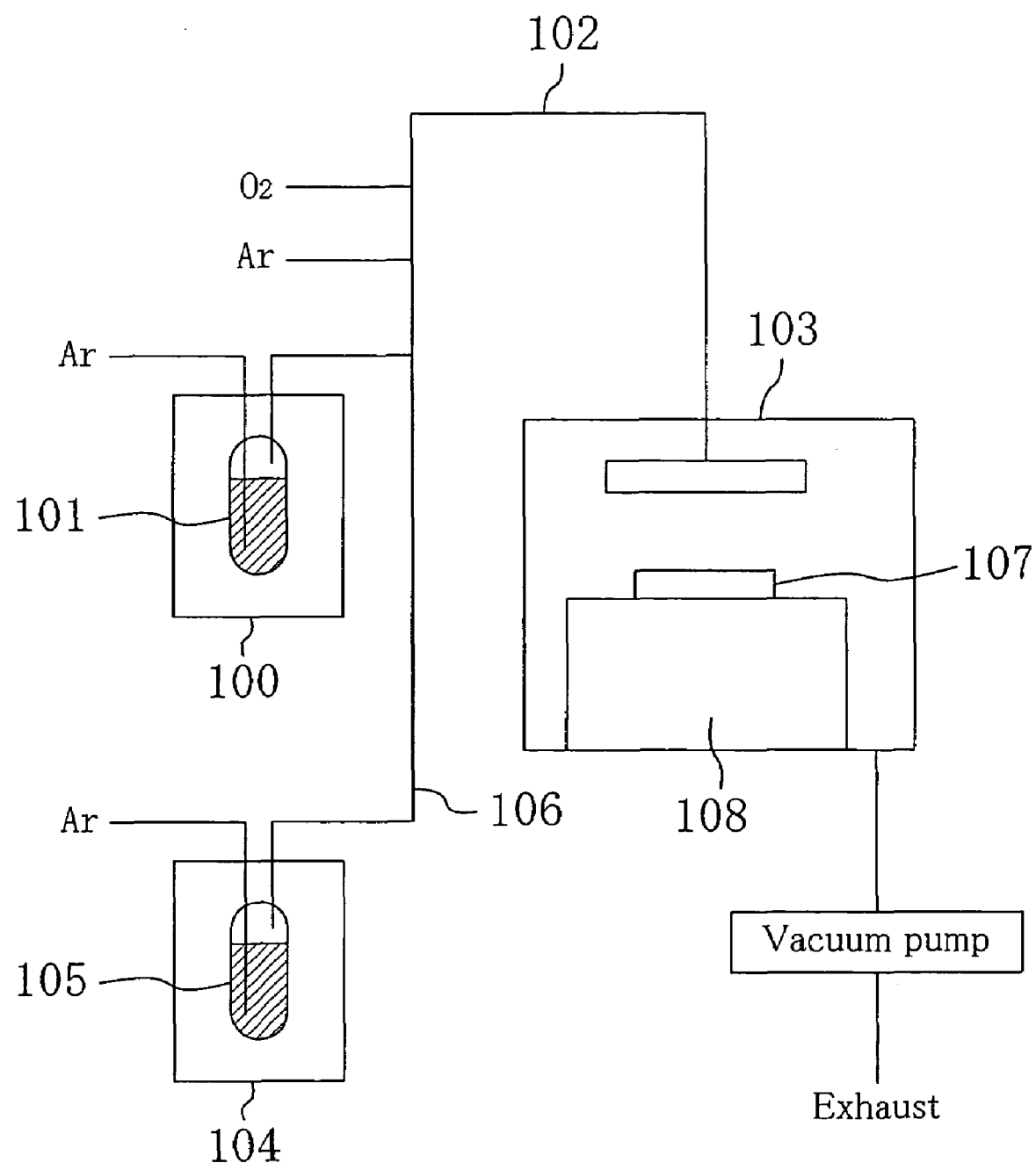
FIG. 19 is a schematic view of a ferroelectric film formation system used for a conventional ferroelectric film formation method.

As shown in FIG. 18, from the evaluation of polarization properties of the ferroelectric film 10, the polarization properties of the ferroelectric film 10 are found to reach 18 μC/cm$^2$ in a 1.8 V application. Therefore, the ferroelectric film 10 even with excellent polarization properties is attained.

As is apparent from the above, with the seventh embodiment, the ferroelectric film 10 can be formed which has an excellent step coverage over the first electrode 9. Moreover, the mixture ratio of the multiple types of source gases constituting the material gas can be determined by a simple approach to form the ferroelectric film containing components in desired proportions.

In the seventh embodiment, description has been made of the ferroelectric film formation method using the first ferroelectric film formation system under the condition shown in the Table 3. Alternatively, the second ferroelectric film formation system may be used.

The present invention is of usefulness in ferroelectric film formation methods providing step coverage improvement and proportion control of a ferroelectric film. Moreover, the present invention is of usefulness in semiconductor devices having ferroelectric films.

What is claimed is:

1. A method for forming a ferroelectric film of insulating metal oxide on a surface of an electrode formed above a substrate, the electrode having a concave or a convex or being of convex shape, wherein multiple types of source gases constituting a material gas and each containing an organometallic compound are introduced into a chamber and main components of the multiple types of source gases are allowed to chemically react with one another with the chemical reaction proceeding depending on the reaction rate, thereby depositing the ferroelectric film on the surface of the electrode.

2. The method of claim 1, wherein the chemical reaction proceeding depending on the reaction rate is carried out under a condition in which the temperature of the substrate during the chemical reaction is 470° C. or lower.

3. The method of claim 1, wherein the chemical reaction proceeding depending on the reaction rate is carried out under a condition in which the pressure within the chamber during the chemical reaction is 6.99×10$^2$ Pa or lower.

4. The method of claim 1, wherein the ferroelectric film grows at a growth rate of 7 nm per minute or lower during the chemical reaction.

5. The method of claim 1, wherein the material gas contains two or more source gases selected from Sr[Ta(OC$_2$H$_5$)$_5$(OC$_2$H$_4$OCH$_3$)]$_2$, Bi[OC(CH$_3$)$_2$(CH$_2$OCH$_3$)]$_3$, Ta(OC$_2$H$_5$)$_5$, Nb(OC$_2$H$_5$)$_5$, La[OC(CH$_3$)$_2$(CH$_2$OCH$_3$)]$_3$, La(OC$_2$H$_5$)$_4$, Ti(OC$_2$H$_5$)$_4$, and Ti[OC(CH$_3$)$_2$(CH$_2$OCH$_3$)]$_3$.

6. The method of claim 1, wherein the material gas is a gas mixture of a first source gas made of Ta(OC$_2$H$_5$)$_5$ and a second source gas made of Sr[Ta(OC$_2$H$_5$)$_5$(OC$_2$H$_4$OCH$_3$)]$_2$.

7. The method of claim 6, wherein the gas mixture is formed by mixing, before introduction into the chamber, the first source gas and the second source gas.

8. The method of claim 6, wherein the gas mixture is formed by mixing, after introduction into the chamber, the first source gas and the second source gas.

* * * * *